(12) United States Patent
Wylie

(10) Patent No.: US 6,853,048 B1
(45) Date of Patent: Feb. 8, 2005

(54) BIPOLAR TRANSISTOR HAVING AN ISOLATION STRUCTURE LOCATED UNDER THE BASE, EMITTER AND COLLECTOR AND A METHOD OF MANUFACTURE THEREOF

(75) Inventor: Ian Wylie, Greenwich, NJ (US)

(73) Assignee: Agere Systems Inc., Allentown, PA (US)

( * ) Notice: Subject to any disclaimer, the term of this patent is extended or adjusted under 35 U.S.C. 154(b) by 21 days.

(21) Appl. No.: 09/637,496

(22) Filed: Aug. 11, 2000

(51) Int. Cl.[7] ..................... H01L 29/00; H01L 27/082
(52) U.S. Cl. ............... 257/517; 257/511; 257/525; 257/552; 257/565
(58) Field of Search ................. 257/511, 512, 257/517, 518, 525–527, 552–564, 565, 566, 576

(56) References Cited

U.S. PATENT DOCUMENTS

| | | | |
|---|---|---|---|
| 4,551,743 A | | 11/1985 | Murakami |
| 4,769,687 A | * | 9/1988 | Nakazato et al. ............ 357/35 |
| 4,949,151 A | * | 8/1990 | Horiuchi et al. ............ 257/508 |
| 4,992,843 A | * | 2/1991 | Blossfeld et al. ............ 357/34 |
| 5,049,521 A | * | 9/1991 | Belanger et al. ............ 438/295 |
| 5,086,322 A | | 2/1992 | Ishii et al. |
| 5,258,642 A | * | 11/1993 | Nakamura ................... 257/514 |
| 5,298,450 A | * | 3/1994 | Verret ......................... 438/207 |
| 5,391,907 A | | 2/1995 | Jang |
| 5,747,871 A | * | 5/1998 | Lee et al. .................... 257/586 |
| 5,834,793 A | | 11/1998 | Shibata |
| 5,877,046 A | | 3/1999 | Yu et al. |
| 5,877,539 A | * | 3/1999 | Yamazaki ................... 257/514 |
| 6,013,936 A | * | 1/2000 | Colt, Jr. ...................... 257/506 |
| 6,246,094 B1 | | 6/2001 | Wong et al. |
| 6,271,566 B1 | | 8/2001 | Tsuchiaki |
| 6,344,669 B1 | | 2/2002 | Pan |
| 6,346,729 B1 | | 2/2002 | Liang et al. |

FOREIGN PATENT DOCUMENTS

| | | | | |
|---|---|---|---|---|
| JP | 5-335329 | * | 12/1993 | ......... H01L/21/331 |
| JP | 5-343415 | * | 12/1993 | ......... H01L/21/331 |
| JP | 411274483 A | | 10/1999 | |

* cited by examiner

Primary Examiner—Ori Nadav

(57) ABSTRACT

The present invention provides a bipolar transistor and a method of manufacture thereof. The bipolar transistor includes a dielectric region located in a semiconductor substrate and a collector located in the semiconductor substrate and at least partially over the dielectric region. The bipolar transistor device further includes a base located over and in contact with the dielectric region and at least partially about the collector and an emitter located over and in contact with the dielectric region and adjacent the base.

34 Claims, 26 Drawing Sheets

BIPOLAR TRANSISTOR HAVING AN ISOLATION STRUCTURE LOCATED UNDER THE BASE, EMITTER AND COLLECTOR AND A METHOD OF MANUFACTURE THEREOF

TECHNICAL FIELD OF THE INVENTION

The present invention is directed, in general, to a bipolar transistor and, more specifically, to a bipolar transistor having a dielectric region located under and in contact with a base and an emitter.

BACKGROUND OF THE INVENTION

The advent of the integrated circuit has had a significant impact on various types of communication devices. The integrated circuit has been incorporated into both radio frequency applications and high speed communication network systems. While operation speeds of these communication devices have dramatically increased, the demand for yet faster communication devices continues to rise. Thus, the semiconductor manufacturing industry continually strives to increase the overall speed of the integrated circuit. One way in which the semiconductor industry has increased the speed of the integrated circuit is to continue to shrink the size of the transistor. Over the last few years, the device size of the transistor has gone from 0.5 µm to 0.32 µm to 0.25 µm and now transistor device sizes are heading to the 0.18 µm range and below. As transistor device sizes have continued to dramatically decrease, with each decrease in size the semiconductor industry has faced new challenges.

One such challenge is that of eliminating parasitic capacitance as much as possible. This is particularly the case in communication devices and communication network systems in general. One integrated circuit component that is often incorporated into these communication devices and networks, is the bipolar transistor. The bipolar transistor facilitates the faster operating speeds that are needed for complex communication network systems because of its inherent ability to switch higher current loads at high speed. However, as device sizes have continued to shrink into the sub-micron size, bipolar transistor scaling has become difficult due to the increased parasitic capacitance per unit area associated with the higher doping levels required for these devices. For example, in some cases, emitter base parasitic capacitance ($C_{EBP}$) can be as high as 60% of the total emitter base capacitance ($C_{EB}$), which severely slows down emitter coupled logic (ECL) type circuits, which are often used in high-speed communication network systems.

The industry has attempted to solve this problem by producing a smaller emitter base overlap to reduce $C_{EBP}$. However, the production of this device often requires more advanced and expensive photolithographic tools. Moreover, increased variability in device parameters can reduce design flexibility and reduce cost. In addition, non-ideal emitter base recombination current can severely degrade device performance.

Another challenge is "cross-talk." As is well known, cross-talk results when electrical noise, which is often a product of the higher current levels associated with bipolar devices, travels through the capacitive coupling of the substrate and negatively affects the performance of other devices located nearby. Though cross-talk has been a well known phenomenon, up until recently it was of less concern. However, as a result of the use of multi-gigahertz operating frequencies in today's RF devices, the significance of cross-talk has increased dramatically. In addition, with the increase in packing density and decrease in device size, bipolar devices and other transistor devices are being manufactured on the same chip with tighter spacing, which increases the relative importance of the cross-talk problem. Thus, as a result of the increased packing density and the decreased device sizes, both taken in conjunction with the cross-talk problems, device performance and integration issues are becoming increasingly apparent.

Accordingly, what is needed in the art is a bipolar transistor and a method of manufacture thereof, that significantly reduces the parasitic capacitance and "cross-talk" problems associated with the prior art bipolar transistors.

SUMMARY OF THE INVENTION

To address the above-discussed deficiencies of the prior art, the present invention provides a bipolar transistor and a method of manufacture thereof. The bipolar transistor includes a dielectric region located in a semiconductor substrate and a collector located in the semiconductor substrate and at least partially over the dielectric region. The bipolar transistor device further includes a base located over and in contact with the dielectric region and at least partially about the collector, and an emitter located over and in contact with the dielectric region and adjacent the base.

The bipolar transistor device taught herein has reduced parasitic capacitance as compared to the prior art bipolar devices. This is a result of the bipolar transistor device being isolated from the substrate and other possible capacitances by the dielectric region, in conjunction with stress relief oxides and nitride sidewall spacers also included in the invention. Moreover, the dielectric region not only reduces parasitic capacitance, but it substantially reduces "cross-talk" caused by electrically noisy bipolar transistors. This further prevents the electrically noisy bipolar transistors from affecting other sensitive devices located on the chip.

In another aspect, the present invention teaches a method of manufacturing the bipolar transistor. The method, in one advantageous embodiment, includes (1) forming a dielectric region in a semiconductor substrate, (2) forming a collector in the semiconductor substrate and at least partially over the dielectric region, (3) forming a base over and in contact with the dielectric region and at least partially about the collector, and (4) forming an emitter over and in contact with the dielectric region and adjacent the base. Further included in the present invention is an integrated circuit, including the bipolar transistor described above. The integrated circuit, may further include CMOS transistor devices, DRAM devices, EPROM devices and EEPROM devices.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1A:
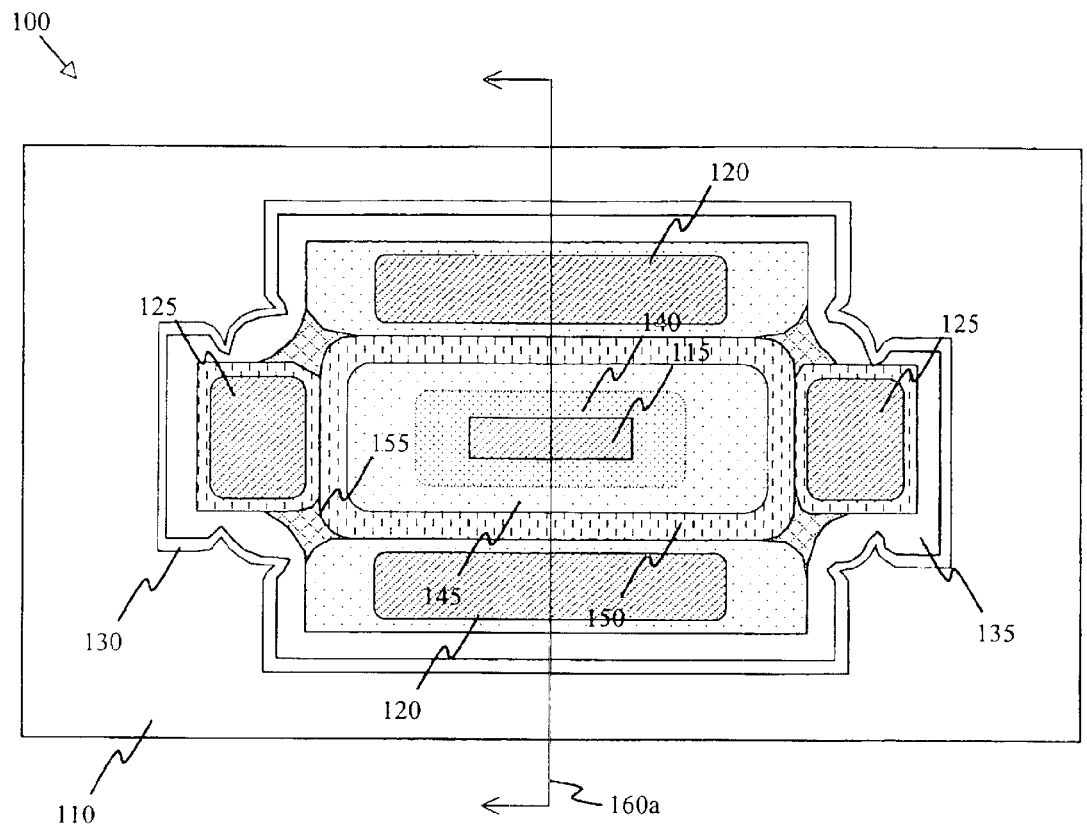
FIGS. 1A, 1B, 1C and 1D illustrate top views and cross-sectional views, through emitter and base contact regions respectively, of a completed bipolar transistor device, manufactured according to the method disclosed herein.
Figure 1B:
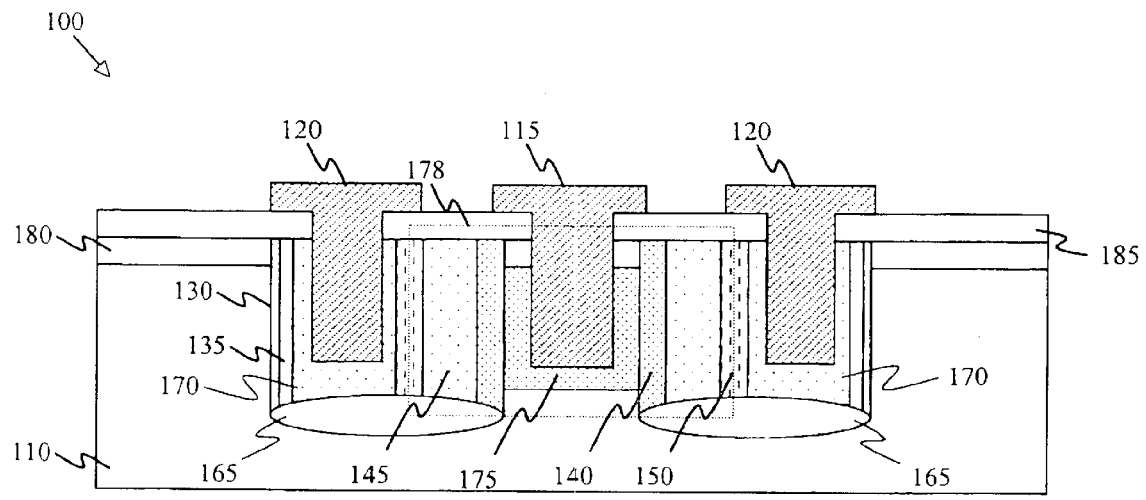
Figure 1C:
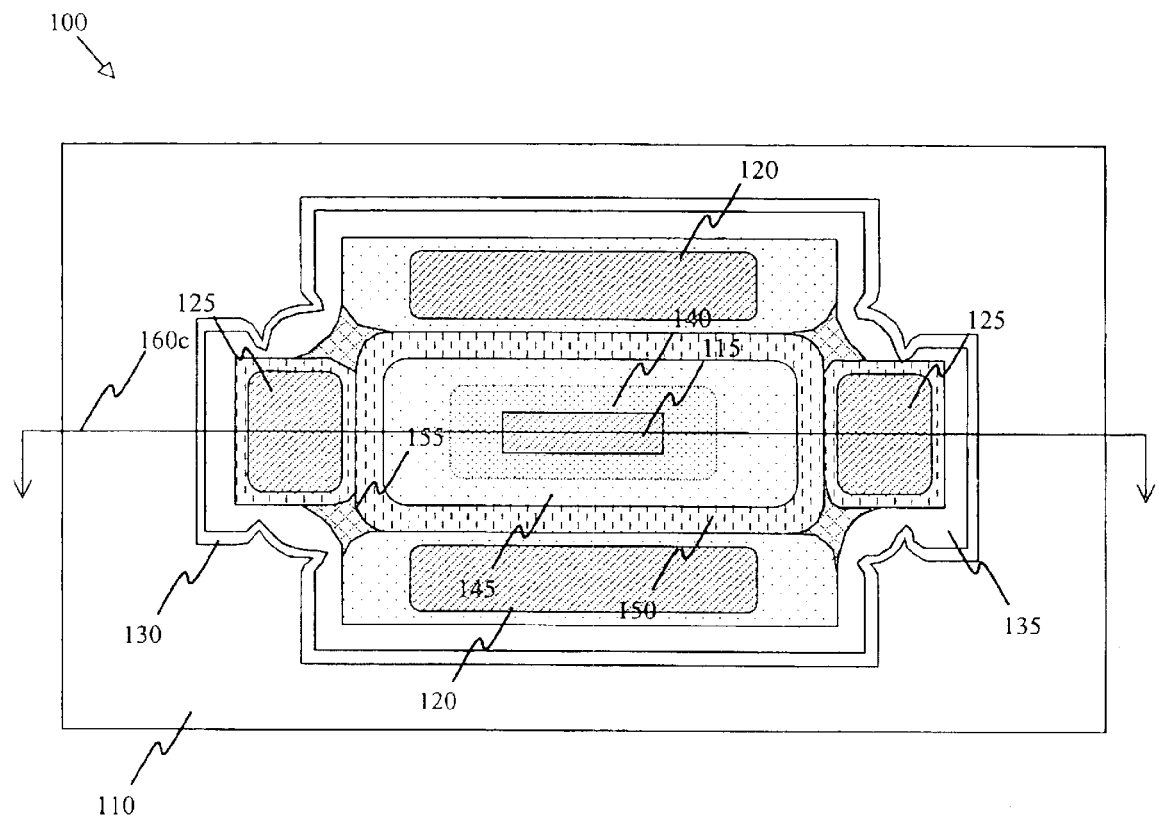

Referring initially to FIGS. 1A, 1B, 1C and 1D, illustrated are top views and cross-sectional views of a completed bipolar transistor device 100, manufactured according to the method described below. The views illustrated in FIGS. 1A and 1C will be described simultaneously, since they are identical. For illustration purposes FIGS. 1A and 1C will be shown without the oxide layer 185 (FIGS. 1B and 1D) obstructing the view of the features therebelow. Illustrated in FIGS. 1A and 1C of the completed bipolar transistor device 100, is a semiconductor wafer substrate 110. The semiconductor wafer substrate 110 may be any layer located in a semiconductor device, including a layer located at the wafer level or a layer located above or below wafer level. Also illustrated in FIGS. 1A and 1C, is a collector plug 115, a pair of emitter plugs 120 and a pair of base plugs 125. The collector plug 115, pair of emitter plugs 120 and pair of base plugs 125 contact a collector contact region, emitter and base contact regions, respectively, discussed in more detail below.

Further illustrated in FIGS. 1A and 1C is a stress relief oxide 130 and a nitride side wall spacer 135. The actual location of both the stress relief oxide 130 and the nitride side-wall spacer 135 will become more clear when discussing one of the cross-sectional views illustrated in FIGS. 1B and 1D, which are described below. Also included in the completed bipolar transistor device 100 is a high dose collector region 140, a low dose collector region 145 and a base 150. The high dose collector region 140 and low dose collector region 145 may comprise the collector and are located in the semiconductor wafer substrate 210 and at least partially over the dielectric region, discussed below. The base 150 is located over and in contact with the dielectric regions and is at least partially about the high dose collector region 140 and the low dose collector region 145, comprising the collector. Isolation structures 155, are also located in FIGS. 1A and 1C of the completed bipolar transistor 100.

Referring to FIG. 1B, illustrated is a cross-sectional view taken through a line 160a illustrated in FIG. 1A. The view illustrated in FIG. 1B shows the semiconductor wafer substrate 110, the collector plug 115, the emitter plugs 120, the stress relief oxide 130, the nitride side wall spacer 135, the high dose collector region 140, the low dose collector region 145 and the base 150. Also illustrated in the view shown in FIG. 1B, but not in the FIG. 1A because of the properties of the view shown, are dielectric regions 165, emitters 170 and a collector contact region 175. The high dose collector region 140, low dose collector region 145 and the collector contact region 175 may, in a preferred embodiment, commonly comprise a collector 178. The emitters 170, as illustrated, are located over and in contact with the dielectric regions 165 and adjacent the base 150. Likewise, in another advantageous embodiment, the collector contact region 175 and a heavily doped collector region 140 may be indistinguishable from one another. A silicon nitride etch stop layer 180 and an oxide layer 185 are also illustrated in FIG. 1B.

Figure 1D:
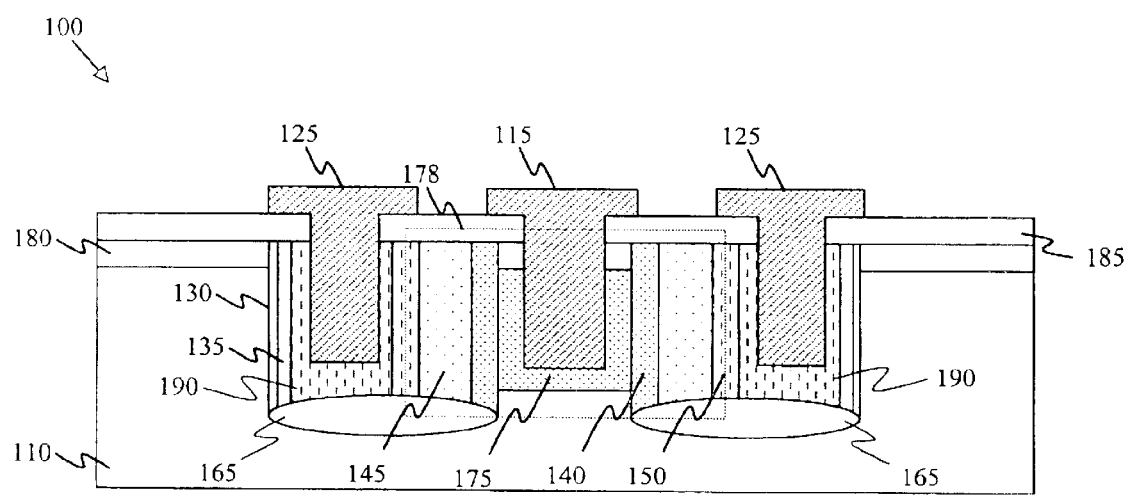

Referring to FIG. 1D, shown is a cross-sectional view taken through a line 160c illustrated in FIG. 1C. The completed bipolar transistor device 100 illustrated in FIG. 1D is similar to the completed bipolar transistor device 100 illustrated in FIG. 1B; however, where the emitters 170 were shown in FIG. 1B, base contact regions 190 are now shown. Similar to above, the base contact region 190 is electrically connected to the base 150, and as such, in an advantageous embodiment is part of the base 150.

The completed bipolar transistor device 100 as illustrated in FIGS. 1A, 1B, 1C and 1D reduces the parasitic capacitance and resistance associated with the prior art bipolar devices. This is a result of the completed bipolar transistor device 100 being isolated from the substrate and other possible capacitances by the oxide isolation regions 165, the oxide isolation regions 165 being much thicker and having a much lower capacitance than corresponding junction depletion layers in the prior art bipolar transistors. The nitride sidewall spacer 135 and the stress relief oxide 130 also provide low capacitance dielectric isolation for the emitter and base contact regions. Moreover, the oxide isolation regions 165, the stress relief oxide 130 and the nitride sidewall spacers 135 not only reduce parasitic capacitance, but they also substantially reduce "cross-talk" caused by electrically noisy bipolar transistors. This further reduces the effect of these noisy bipolar transistors on other sensitive devices located on the semiconductor wafer substrate 110.

The use of the collector plug 115, emitter plug 120 and base plug 125 further reduces the parasitic resistance of the completed bipolar transistor device 100. This is a result of the proximity of the low resistance plug metal to the active device area. Moreover, the completed bipolar transistor device 100 also allows for improvement in the flexibility of the design of the completed bipolar transistor device 100 through the use of innovative structures and processing steps.

Figure 2A:
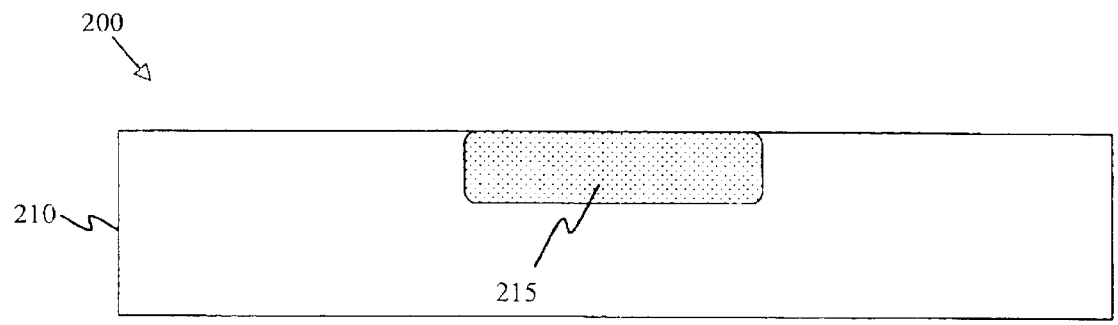
FIG. 2A illustrates a semiconductor wafer substrate after formation of a collector contact region therein.

Turning now to FIGS. 2A–24B, with continued reference to FIGS. 1A, 1B, 1C and 1D, illustrated are detailed manufacturing steps instructing how one might, in a preferred embodiment, manufacture the completed bipolar transistor device 100 depicted in FIGS. 1A, 1B, 1C and 1D. FIG. 2A illustrates a semiconductor wafer substrate 210 after formation of a collector contact region 215 therein. In one particularly advantageous embodiment, the semiconductor wafer substrate 210 is a single crystal silicon semiconductor wafer substrate. The collector contact region 215 may, in an exemplary embodiment, contain a very high dose of an n-type dopant. For example, the collector contact 215 could be phosphorous doped to a concentration of about $2E16/cm^3$. However, one skilled in the art knows that other dopants, for example arsenic, may be used to form the collector contact region 215, and furthermore, that other concentrations can be used. One having skill in the art knows the conventional method used to form implanted regions within a substrate, therefore, further details a will not be discussed. In an alternative embodiment ion w implantation of the collector contact region 215 could be replaced by solid phase diffusion of the collector contact region 215. Such an alternative embodiment would be implemented during the steps shown in FIGS. 3A and 3B.

Figure 2B:
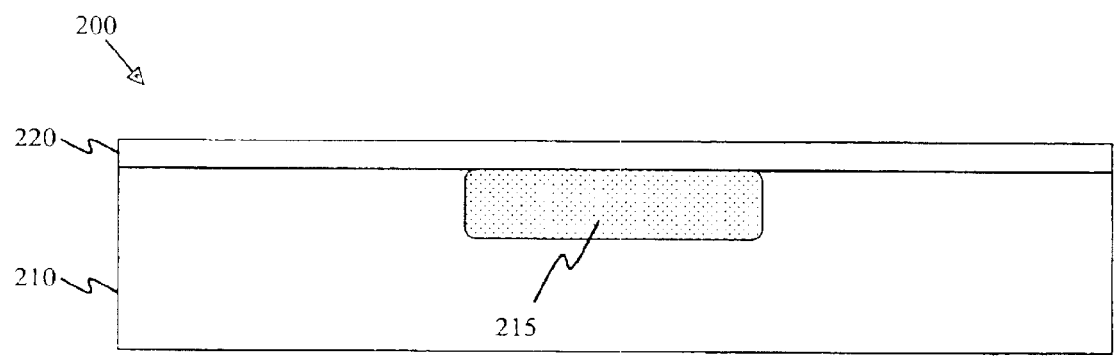
FIG. 2B illustrates the partially completed bipolar transistor illustrated in FIG. 2A, after deposition of a thin etch stop layer using a conventional chemical vapor deposition (CVD), or other similar process.
Figure 2C:
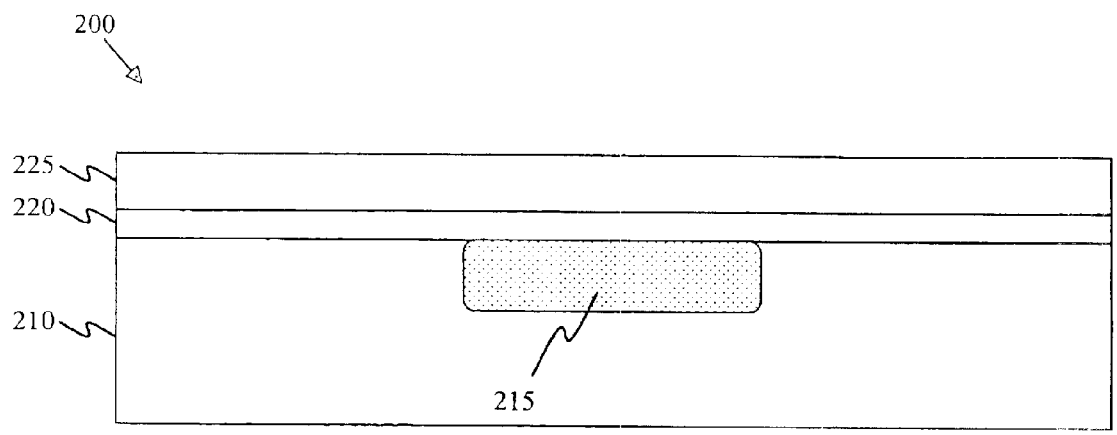
FIG. 2C illustrates the partially completed bipolar transistor illustrated in FIG. 2B after formation of an oxide layer, or other sacrificial layers, over the etch stop layer.

Turning briefly to FIG. 2B, illustrated is the partially completed bipolar transistor 200 illustrated in FIG. 2A, after deposition of a thin etch stop layer 220 using a conventional chemical vapor deposition (CVD) or other similar process. In an exemplary embodiment, the etch stop layer 220 is a silicon nitride etch stop layer having a thickness of about 30 nm. As illustrated, the etch stop layer 220 is deposited over the entire surface of the semiconductor wafer substrate 210. The etch stop layer 220 also prevents oxidation of the semiconductor wafer substrate 210. Now, turning briefly to FIG. 2C, illustrated is the partially completed bipolar transistor 200 illustrated in FIG. 2B after formation of an oxide layer 225 over the etch stop layer 220. The oxide layer 225 may be deposited using a conventional CVD, spin on glass (SOG) or other similar process, and in an exemplary embodiment is about 100 nm thick. Moreover, the oxide layer 225 is a sacrificial layer that will be removed in a subsequent processing step.

Figure 3A:
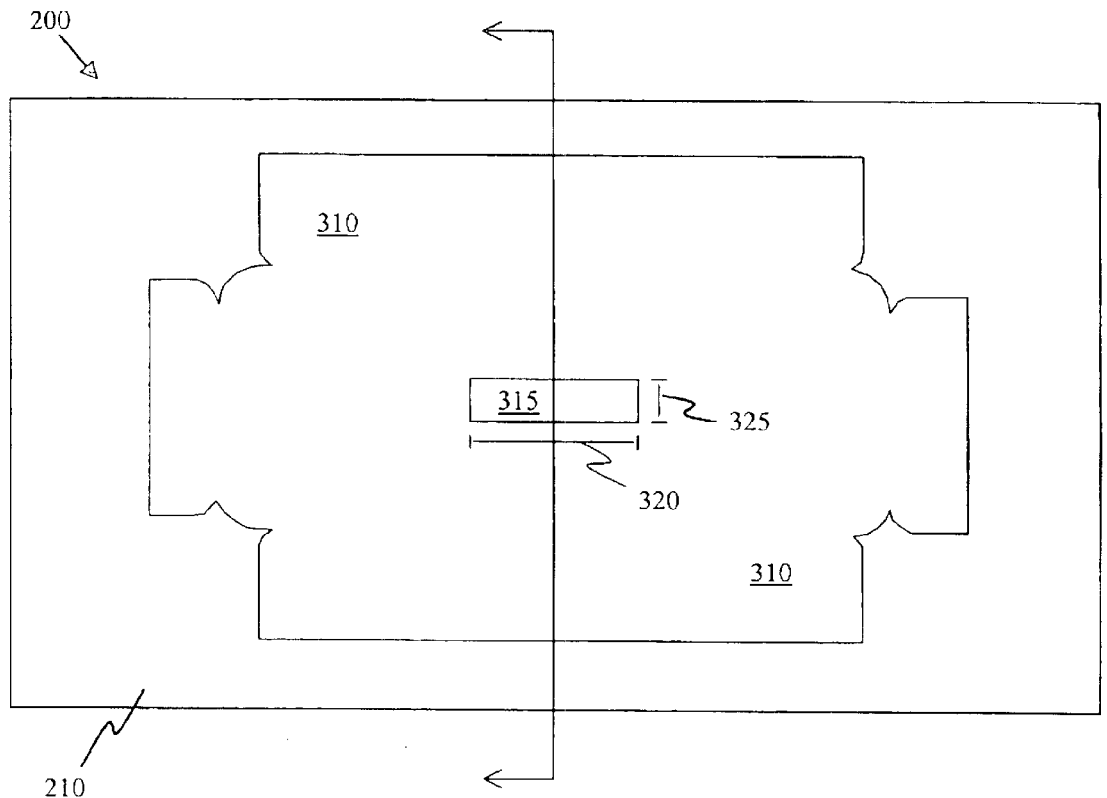
FIGS. 3A and 3B illustrate the formation of a trench within the partially completed bipolar transistor illustrated in FIG. 2C.
Figure 3B:
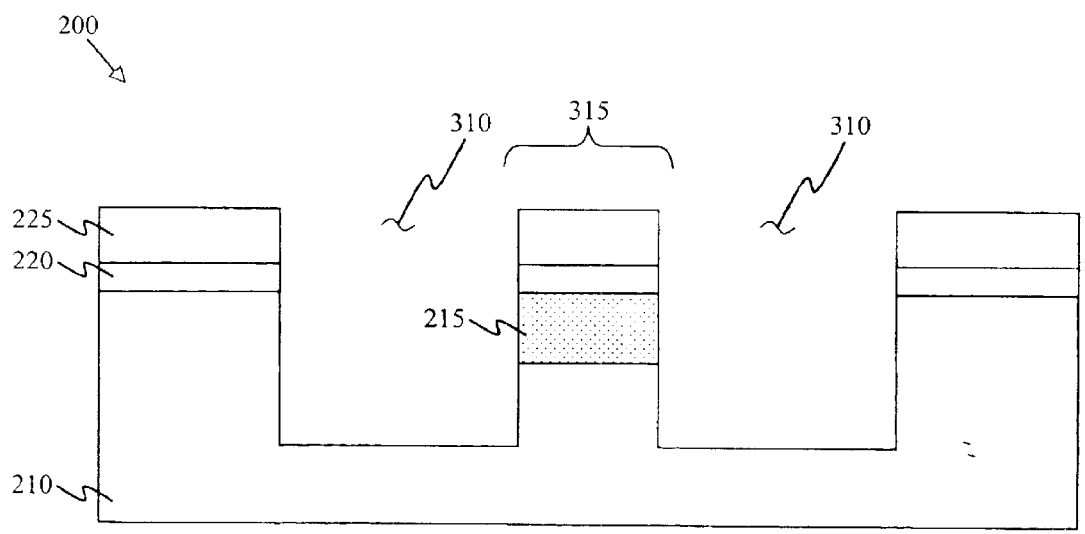

Referring to FIGS. 3A and 3B, illustrated is the formation of a trench 310 within the partially completed bipolar transistor 200 illustrated in FIG. 2C. The trench 310 may be formed in many ways, but in an exemplary embodiment a first dielectric trench etch is used to remove the desired oxide layer 225 and etch stop layer 220, and a second plain silicon trench etch is used to remove the desired amount of the semiconductor wafer substrate material. In an alternative exemplary embodiment, the first dielectric trench etch is only used to remove the desired oxide layer 225, and the second plain silicon trench etch is used to remove the desired etch stop layer 220 and the desired semiconductor wafer substrate material. In one particularly advantageous embodiment illustrated in the top view 302, the trench 310 has a cross-like shape. The benefit of the cross-like trench 310 will be discussed with respect to FIGS. 12A, 12B, 13A and 13B. However, one having skill in the art knows that the trench 310 is not limited to this cross-like shape and may include any shape consistent with the design of the bipolar transistor device. The trench 310, in an advantageous embodiment, may be formed to a depth of about 300 nm. A collector post 315 is produced by forming the trench 310, as shown in both the top view and the cross-sectional view. The collector post 315 eventually will form the collector contact region 215 having a collector plug 115 within, of the completed bipolar transistor device 100 illustrated in FIGS. 1A and 1B. The collector post 315, in an illustrative embodiment, may have a length 320 of about 1000 nm and a width 325 of about 500 nm.

Figure 4A:
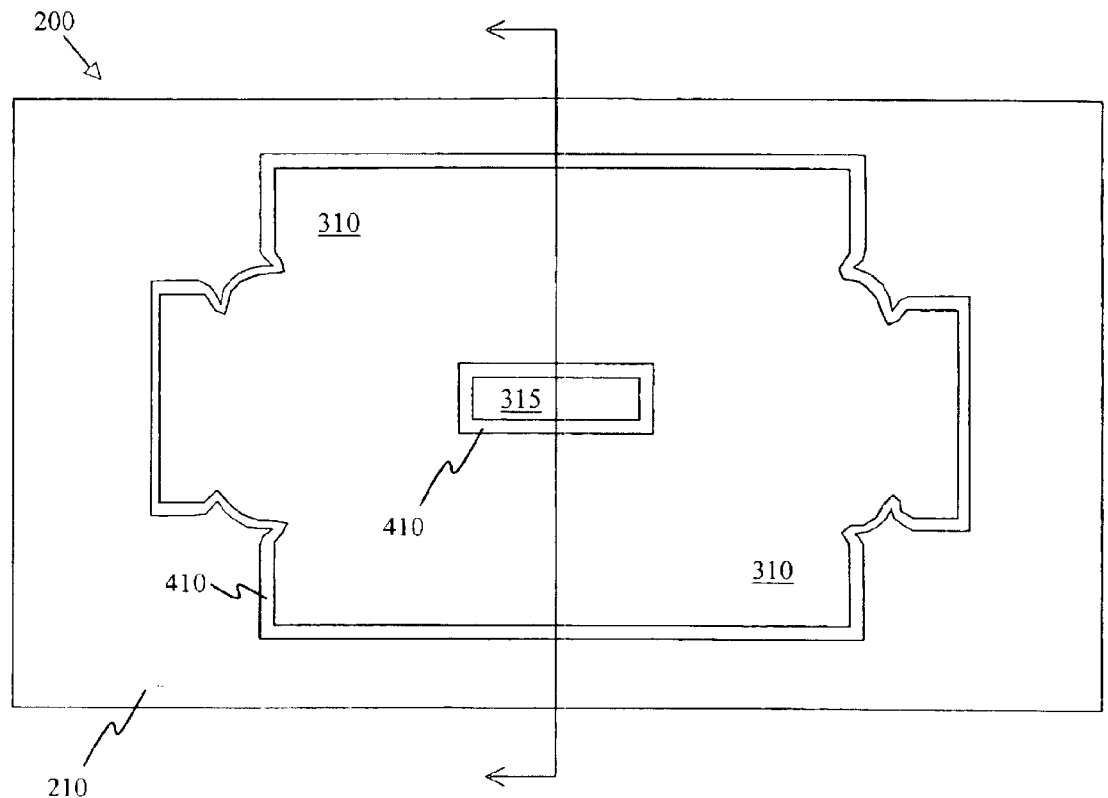
FIGS. 4A and 4B illustrate the formation of a stress relief pad oxide around the trench bottom and trench sidewalls.
Figure 4B:
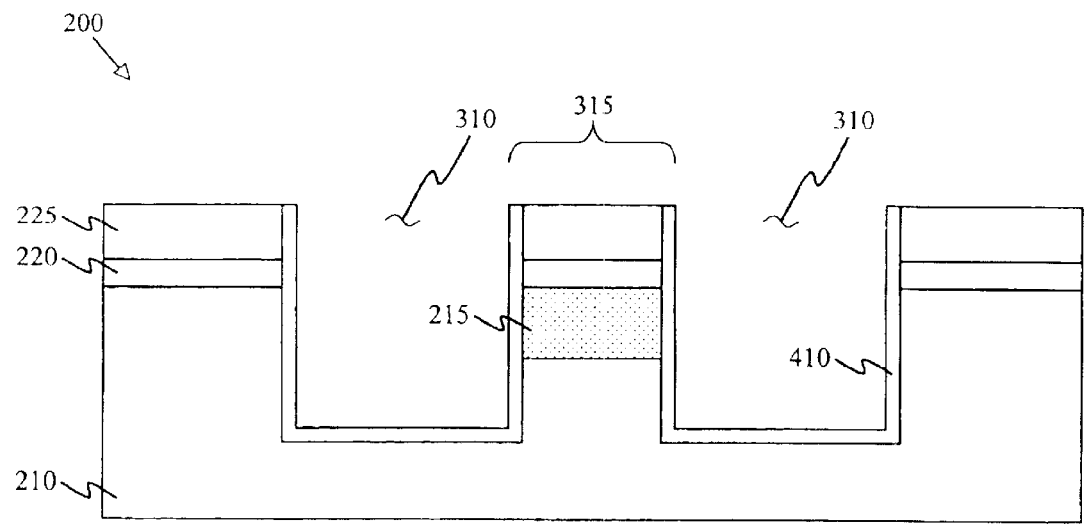

Turning to FIGS. 4A and 4B, illustrated is the formation of a stress relief pad oxide 410 around the trench bottom and trench sidewalls. The stress relief pad oxide 410 may be formed using conventional pad oxide formation processes. For example, the stress relief pad oxide 410 could be formed by a light oxidation process, oxide deposition process or other similar known process. The details of forming the stress relief pad oxide 410 are well known in the art, therefore, the process has been given limited discussion. The thickness of the stress relief pad oxide 410 in comparison to a thin layer of nitride, described below, is a critical element. The thickness of the stress relief pad oxide 410 should be predetermined such that it reduces the vertical stress placed upon the semiconductor wafer substrate by a sidewall spacer, formed in the following FIGURES. For example, in an advantageous embodiment, the stress relief pad oxide 410 has a thickness of about 10 nm.

Figure 5A:
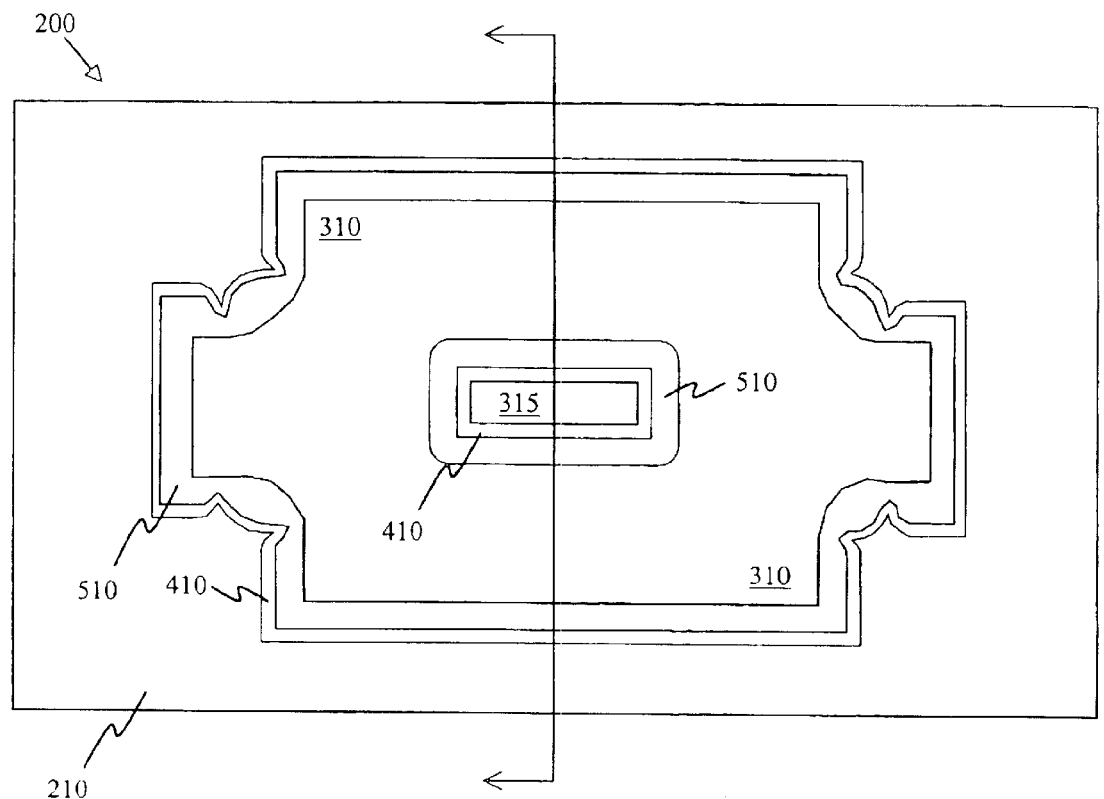
FIGS. 5A and 5B illustrate the partially completed bipolar transistor device illustrated in FIGS. 4A and 4B, after formation of sidewall spacers.
Figure 5B:
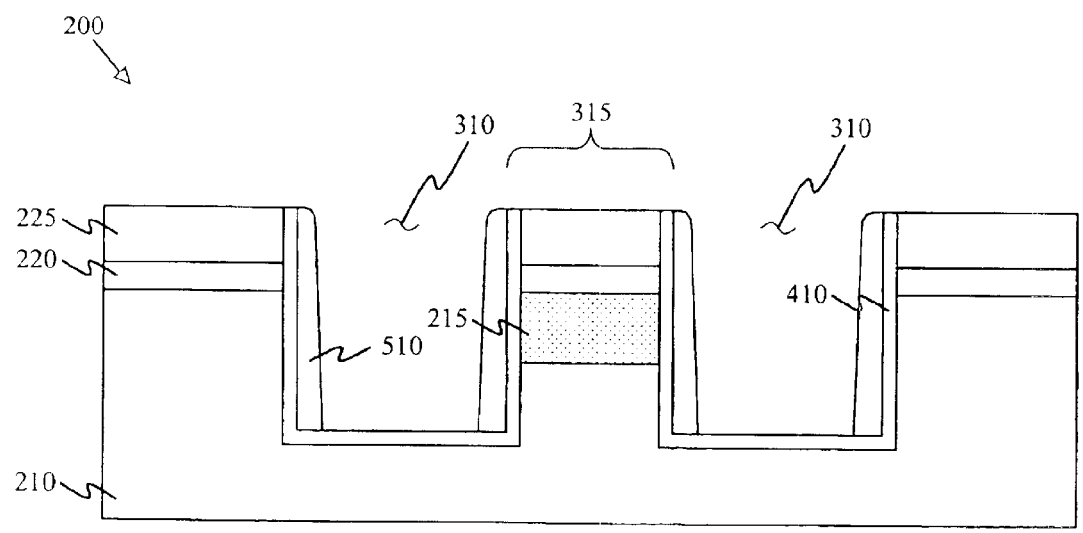

Turning to FIGS. 5A and 5B, illustrated is the partially completed bipolar transistor device 200 illustrated in FIGS. 4A and 4B, after formation of sidewall spacers 510. The sidewall spacers 510, in an exemplary embodiment, are formed by depositing a thin layer of nitride over the surface of the partially completed bipolar transistor device 200 illustrated in FIGS. 4A and 4B, and performing a traditional anisotropic etch, resulting in the sidewall spacers 510 on the trench 310 walls. It is only imperative that the sidewall spacers 510 be located on the sidewall of the post 315, since one of their purposes is to prevent an oxide from growing on the post 315 in a subsequent step. Since forming the sidewall spacers 510 only on the post 315 might require an additional processing step, and no harm is realized if the sidewall spacers 510 are formed over all the trench 310 walls, an advantageous embodiment has the sidewall spacers 510 being formed on all the trench 310 walls. In an illustrative embodiment, it is desired for the sidewall spacers 510 to have a thickness of about 80 nm; however, other thicknesses may be used.

Figure 6A:
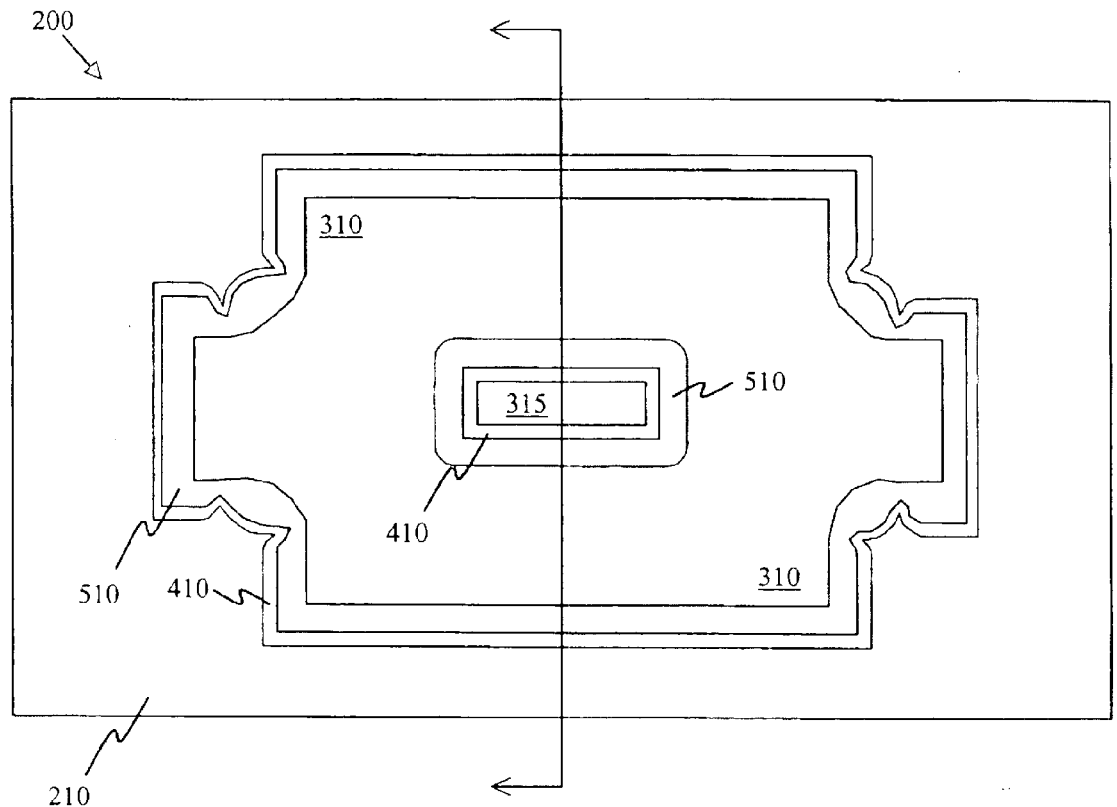
FIGS. 6A and 6B illustrate the partially completed bipolar Vo transistor device shown in FIGS. 5A and 5B after the formation of dielectric regions.
Figure 6B:
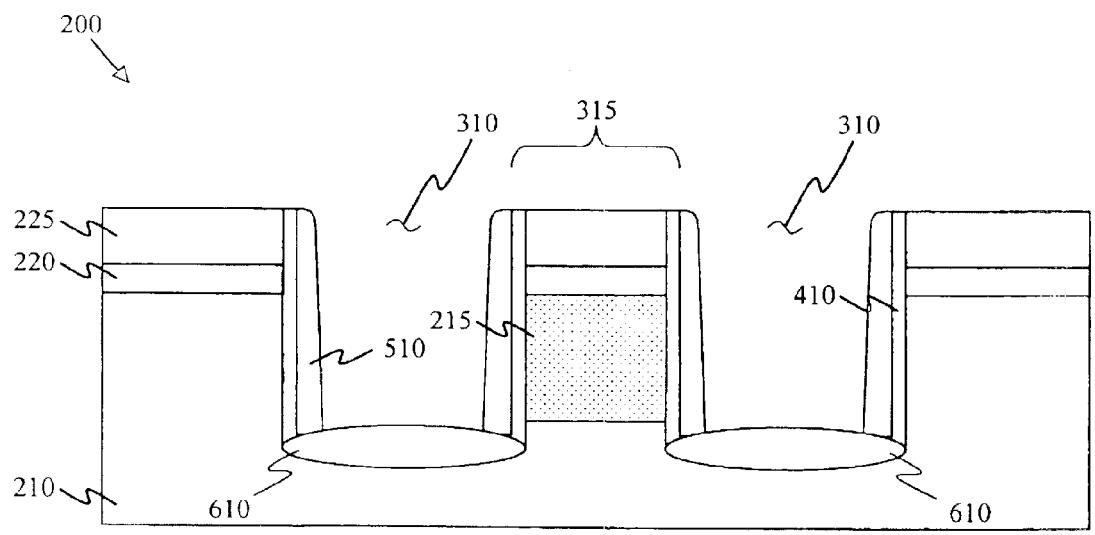

Turning to FIGS. 6A and 6B, illustrated is the partially completed bipolar transistor device 200 shown in FIGS. 5A and 5B, after the formation of dielectric regions 610. As illustrated, the dielectric regions 610, such as oxide regions, are formed in the bottom of the trench 310 and within the semiconductor wafer substrate 210. In one illustrative embodiment, the dielectric regions 610 have a thickness ranging from about 100 nm to about 200 nm. The dielectric regions 610 will be used, once the device is completed, to isolate the bipolar transistor device from the substrate 210 and also to reduce cross-talk between the bipolar transistor device and other semiconductor devices on the chip. In an advantageous embodiment, the thermal budget associated with the formation of the dielectric regions 610 causes the collector contact region 215 to diffuse down the post 315.

Figure 7A:
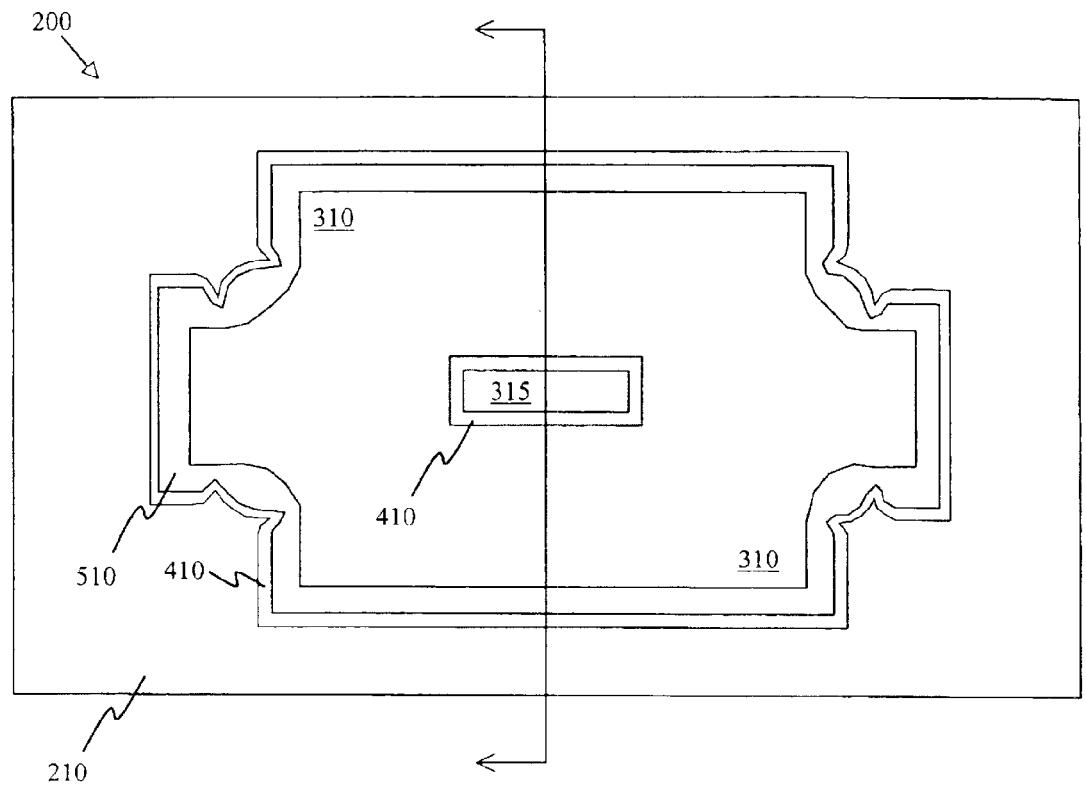
FIGS. 7A and 7B illustrate the partially completed bipolar transistor device of FIGS. 6A and 6B, undergoing removal of the sidewall spacers from the wall of the post.
Figure 7B:
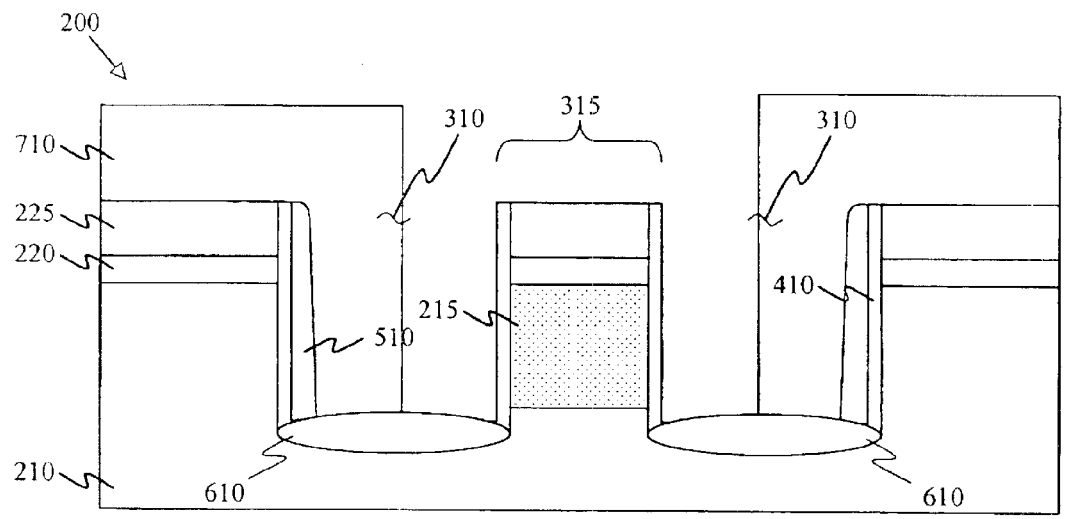

Turning to FIGS. 7A and 7B, illustrated is the partially completed bipolar transistor device 200 of FIGS. 6A and 6B, undergoing removal of the nitride sidewall spacers 510 from the wall of the post 315. To remove the nitride sidewall spacers 510 from the wall of the post 315, a conformal layer of photoresist is deposited, patterned and developed leaving a photoresist portion 710, shown in FIGS. 7A and 7B. An etch and removal of the sidewall spacer 510 from the post 315 can then be conducted, resulting with the partially completed bipolar transistor device 200 illustrated in FIGS. 7A and 7B.

Figure 8A:
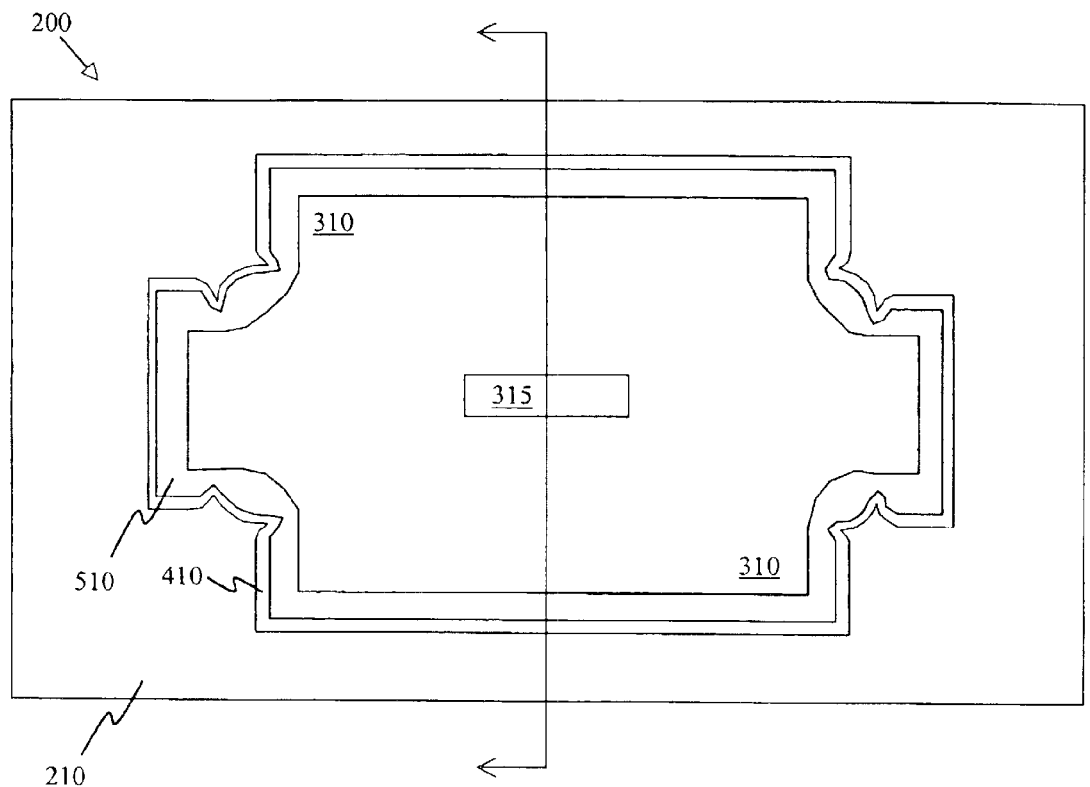
FIGS. 8A and 8B illustrate the partially completed bipolar transistor device illustrated in FIGS. 7A and 7B, including the photoresist portion, after removal of the stress relief pad oxide from the wall of the post.
Figure 8B:
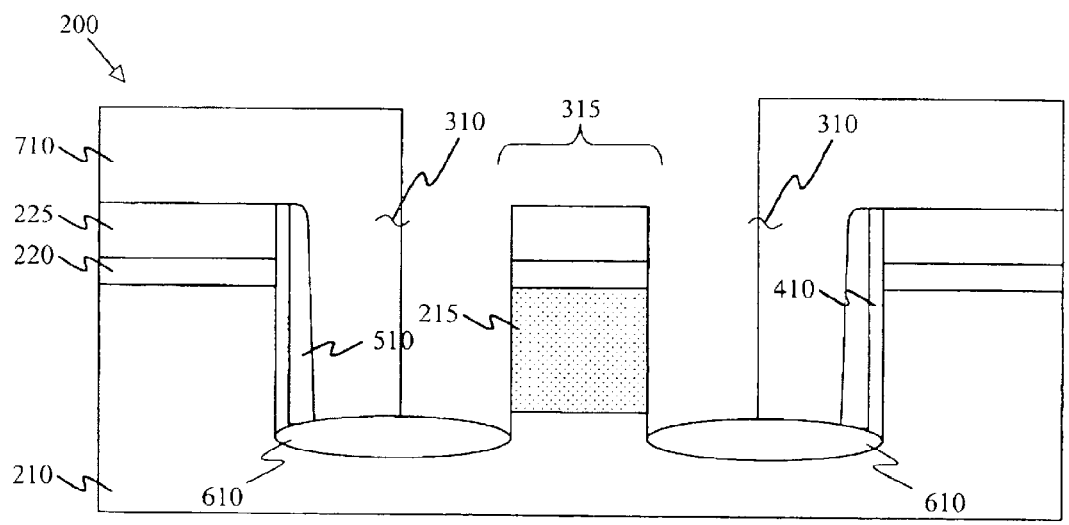

Referring briefly to FIGS. 8A and 8B, illustrated is the partially completed bipolar transistor device illustrated in FIGS. 7A and 7B, including the photoresist portion 710, after removal of the stress relief pad oxide 410 from the wall of the post 315. Conventional methods are used to remove the stress relief pad oxide 410. For instance, in one advantageous embodiment, a hydrofluoric (HF) acid wet etch is used to remove the stress relief pad oxide 410. In an optional step after the removal of the stress relief pad oxide 410, the wall of the post 315 may be subjected to a special sidewall clean to assure that the wall of the post 315 is totally clean. For instance, a wet oxidation of 10 nm followed by a oxide strip, could be used to clean the wall of the post 315. After the nitride sidewall spacers 510 and pad oxide 410 have been removed from the wall of the post 315, and the wall of the post 315 is sufficiently clean, the photoresist portion 710 may be removed using conventional techniques. It should be noted that the thickness of the dielectric regions 610 should be sufficient to withstand both the pad oxide wet etch and the wet oxidation oxide strip.

Figure 9A:
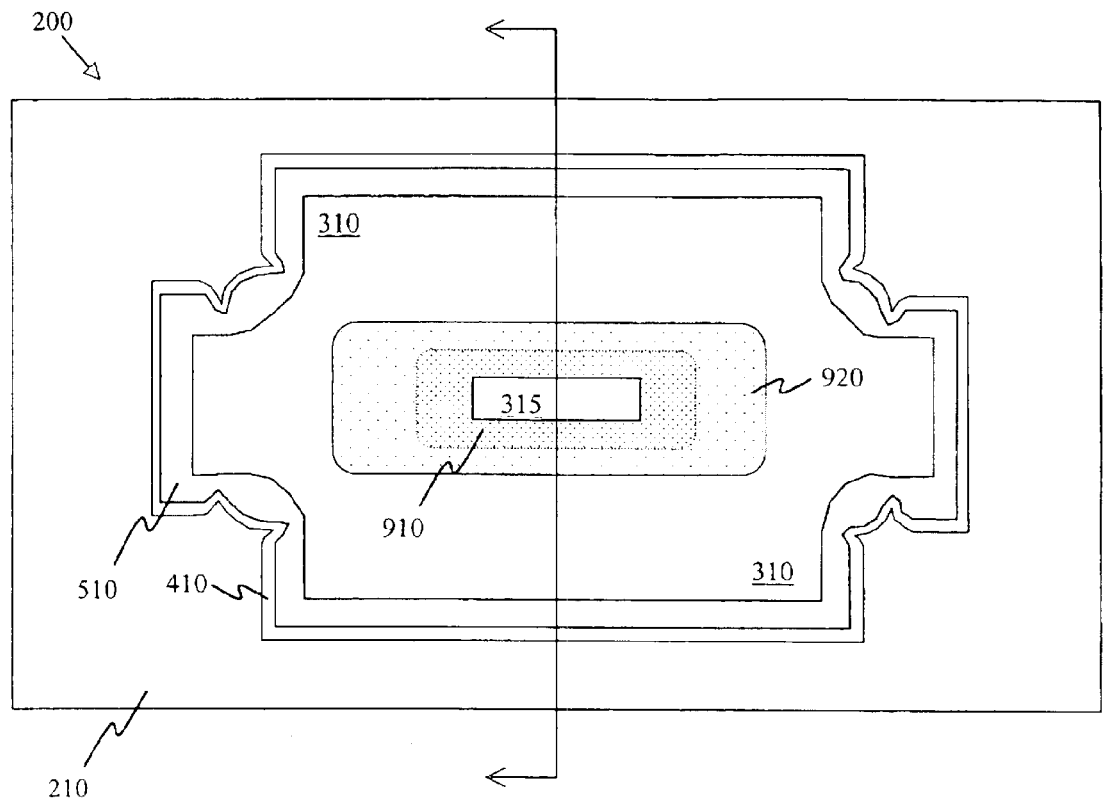
FIGS. 9A and 9B illustrate the formation of a high dose collector region and a low dose collector region.
Figure 9B:
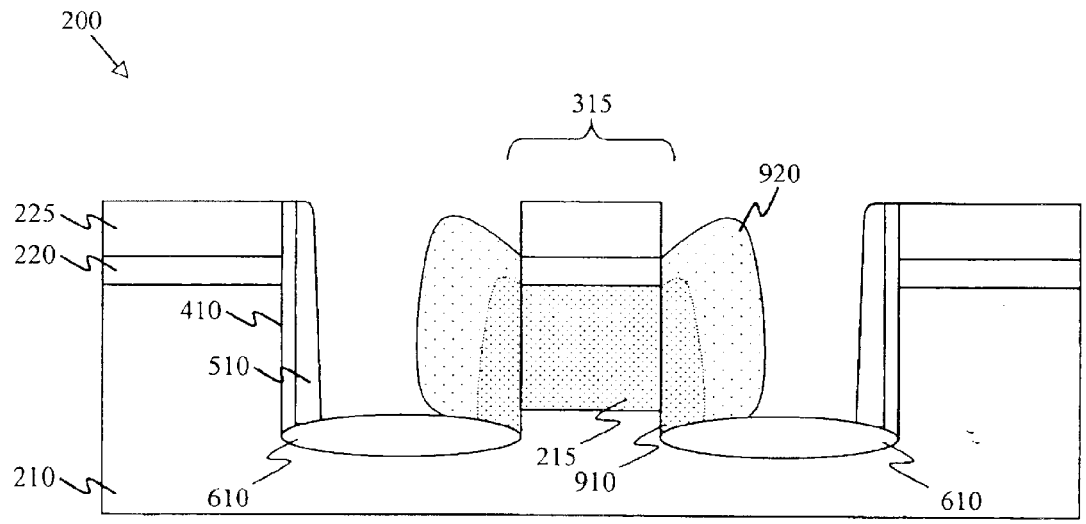

Turning to FIGS. 9A and 9B, illustrated is the formation of a high dose collector region 910 and a low dose collector region 920. To form the high does collector region 910 and the low dose collector region 920, the partially completed bipolar transistor device 200 illustrated in FIGS. 8A and 8B, may be placed within an ultrapure environment and exposed to silane gas. The silane gas should react with the single crystal silicon present in the post 315 and grow outwards. Since the collector contact region 215 is highly doped, the region closest to the collector contact region 215, i.e., the high dose collector region 910, has a higher dopant concentration than the region farthest from the collector contact region 215, i.e., the low dose collector region 920. The high dose collector region 910 is very similar to what is generally referred to as a buried layer in a conventional bipolar transistor, and reduces collector resistance. In an illustrative embodiment, the high dose collector region 910 has a dopant concentration ranging from about $1E19/cm^3$ to about $1E20/cm^3$ and the low dose collector region 920 has a dopant concentration ranging from about $1E16/cm^3$ to about $1E17/cm^3$. In another illustrative embodiment, the high dose collector region 910 has a width of about 100 nm and the low dose collector region 920 has a width ranging from about 400 nm to about 600 nm. Together, the high dose collector region 910 and the low dose collector region 920 will comprise the collector of the completed bipolar transistor device illustrated in FIGS. 1A, 1B, 1C and 1D. However, as mentioned above, the collector contact region 215 could also form part of the collector of the completed bipolar transistor device.

Figure 10A:
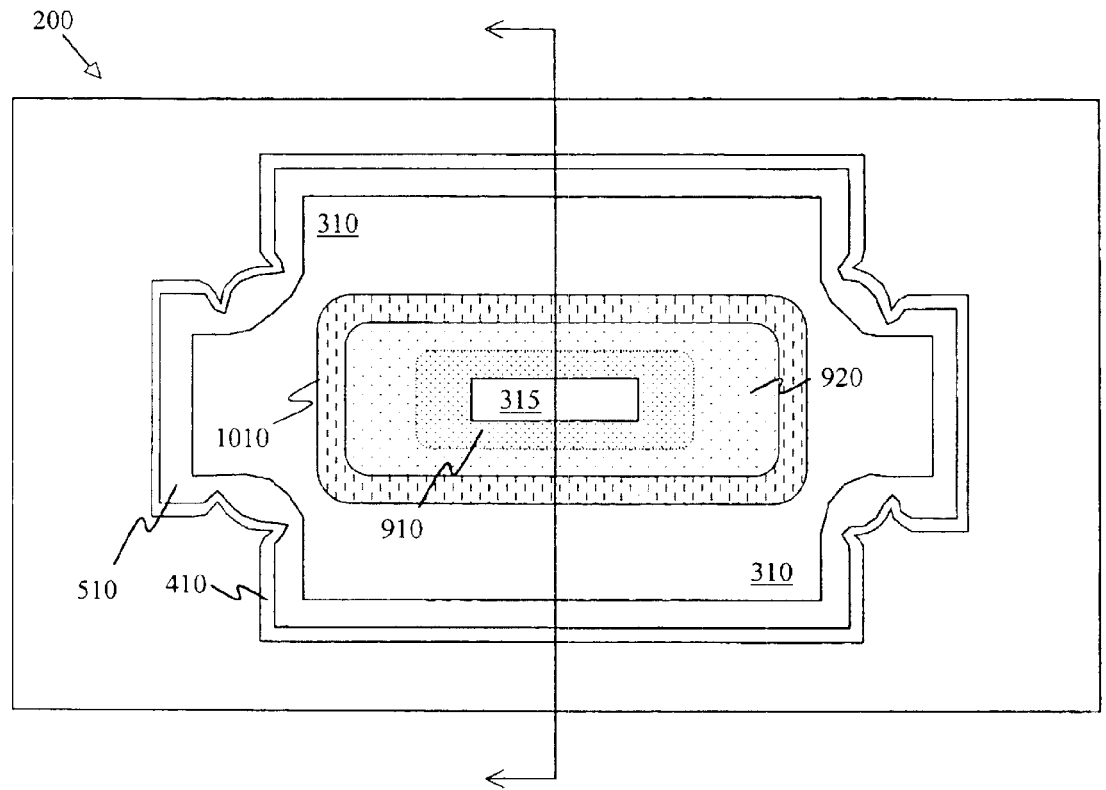
FIGS. 10A and 10B illustrate the formation of a base.
Figure 10B:
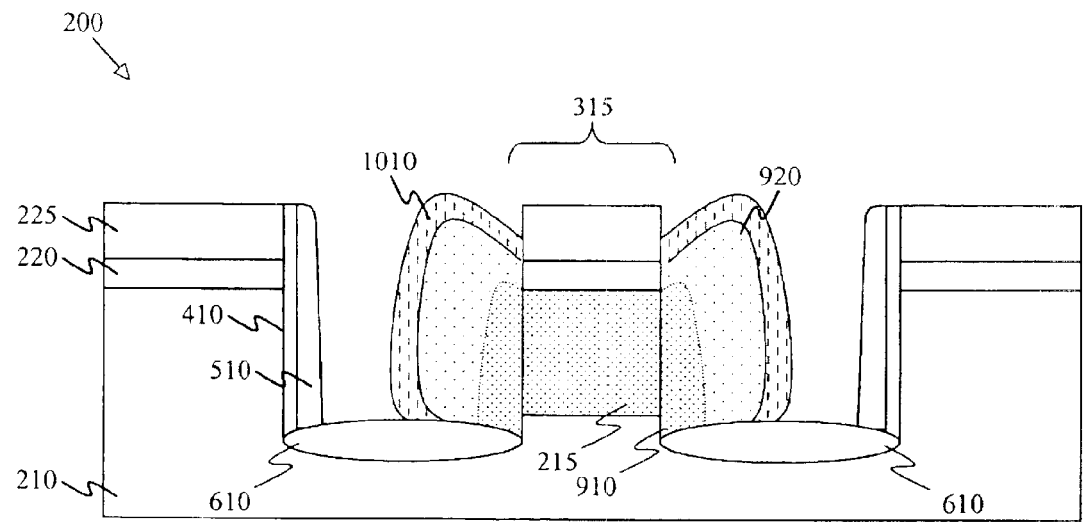

After the high dose collector region 910 and the low dose collector region 920 are formed, the partially completed bipolar transistor device 200 should remain within the ultrapure environment while diborane is added to a base forming gas, thus, resulting in the base 1010 illustrated in FIGS. 10A and 10B. The base 1010 is a very important feature of a bipolar transistor, so it is very important that it be precisely manufactured to a predetermined thickness and concentration. In an exemplary embodiment, the base 1010 is formed having a thickness of about 100 nm and a concentration ranging from about $1E18/cm^3$ to about $1E19/cm^3$. Fortunately, the control of concentration profiling possible with epi is superior to almost any other method, and so 55 the final device should have relatively well controlled parametrics. In an exemplary embodiment, it is also possible to grade the concentration in the base 1010 so as to introduce a drift field that would considerably decrease the electron transit time in the base 1010.

Figure 11A:
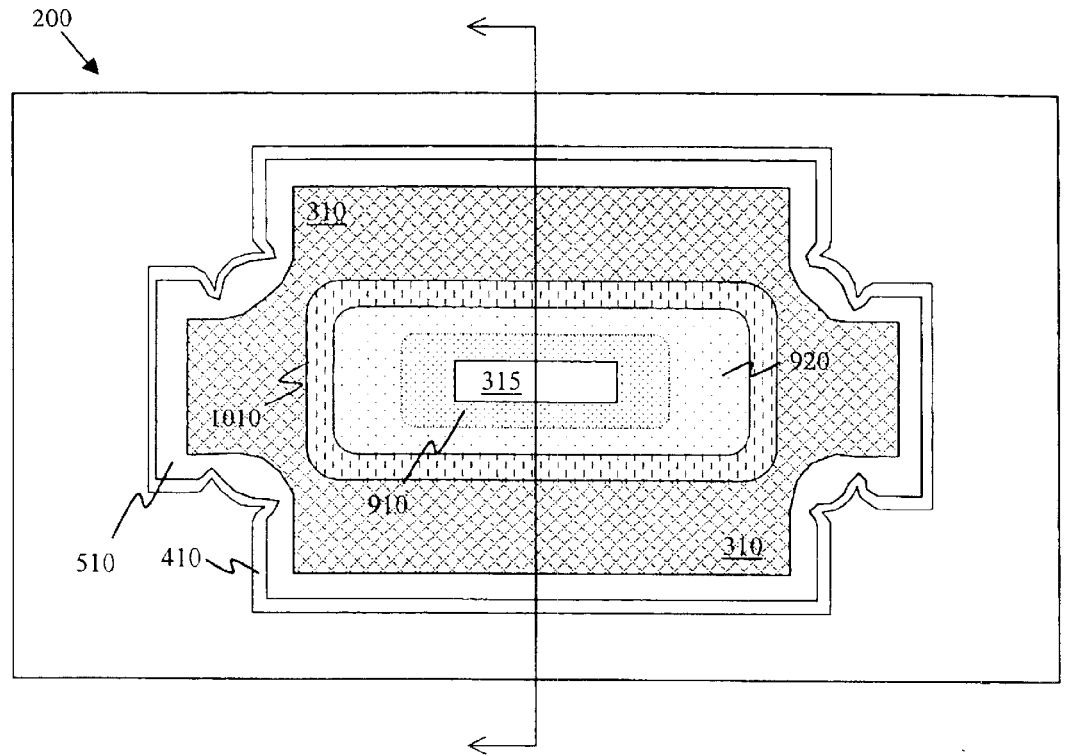
FIGS. 11A and 11B illustrate the partially completed bipolar transistor device illustrated in FIGS. 10A and 10B after deposition of a dielectric material in the remainder of the trench.
Figure 11B:
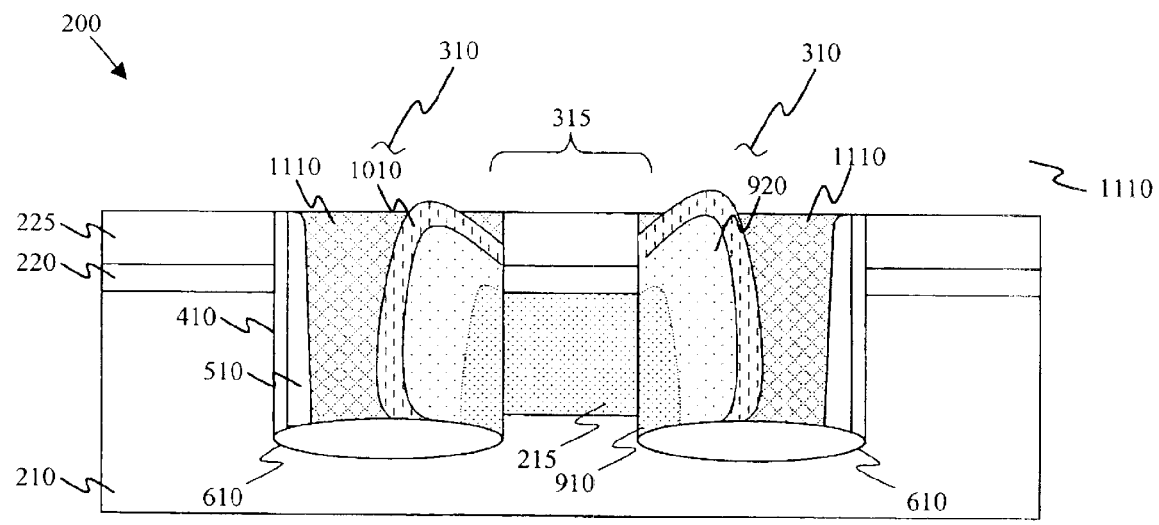

Turning to FIGS. 11A and 11B, illustrated is the partially completed bipolar transistor device 200 illustrated in FIGS. 10A and 10B after deposition of a dielectric material 1110 in the remainder of the trench 310. The dielectric material 1110 may be many dielectric materials, but in an exemplary embodiment is an oxide. Moreover, the dielectric material 1110 may be formed using conventional processes, including a CVD or SOG process.

Figure 12A:
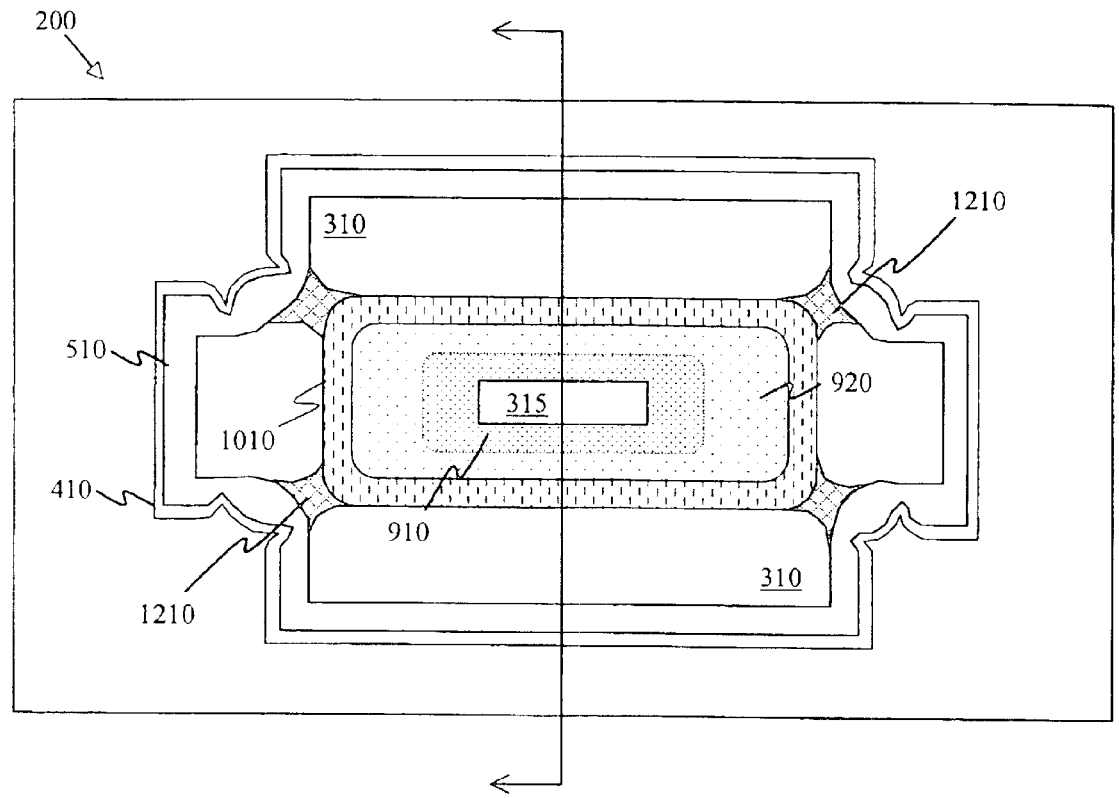
FIGS. 12A, 12B, 13A and 13B illustrate the partially completed bipolar transistor device illustrated in FIGS. 11A and 11B after formation of isolation spacers.
Figure 12B:
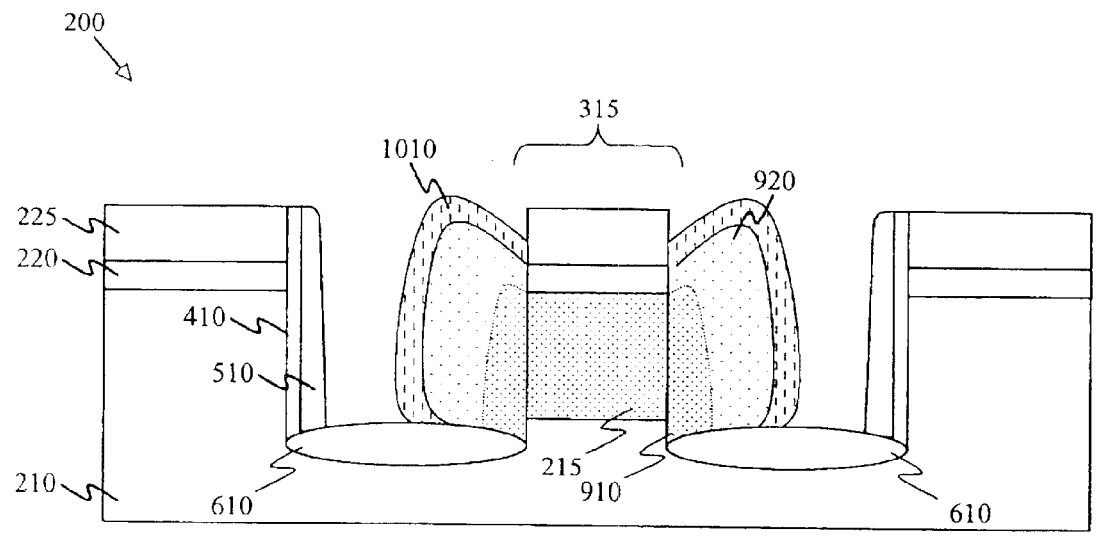
Figure 13A:
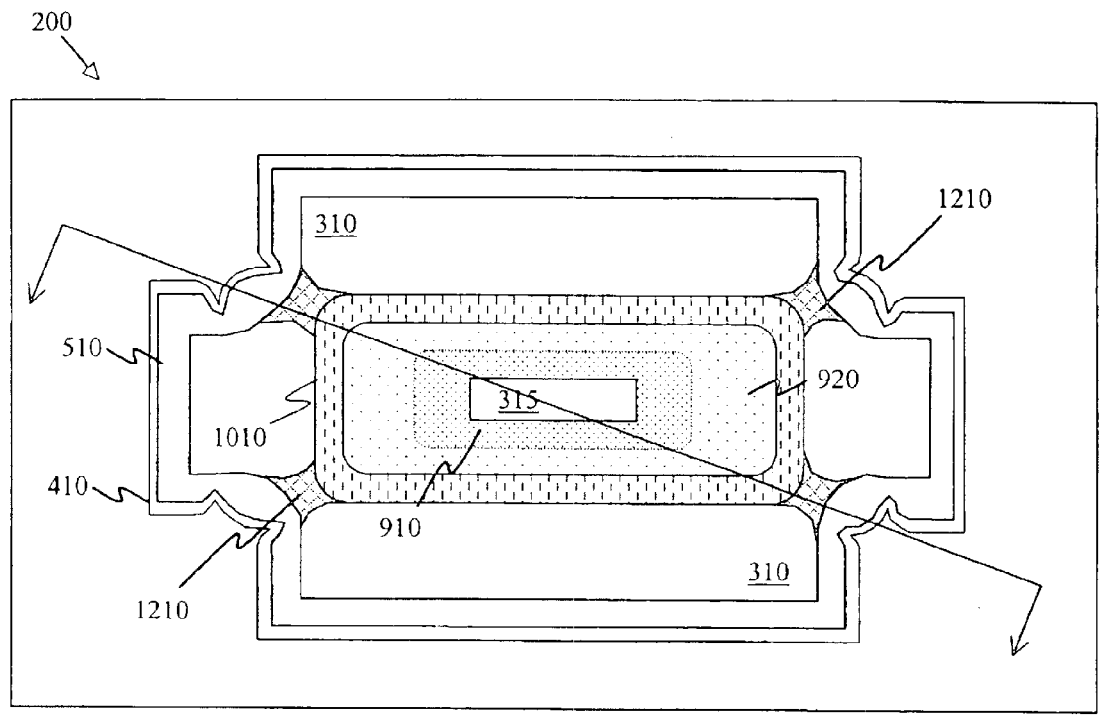
Figure 13B:
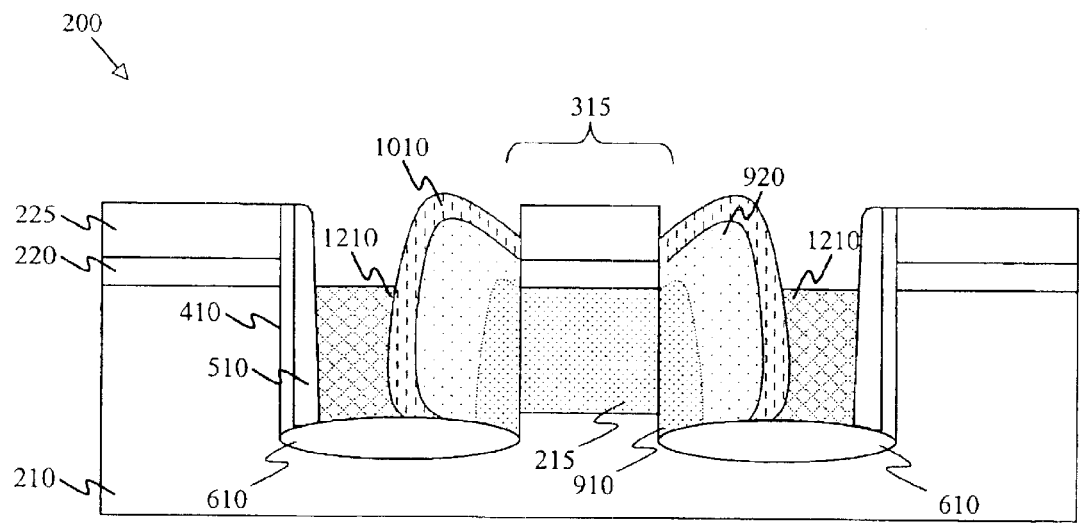

After forming the dielectric material 1110 within the remainder of the trench 310, a traditional wet oxide etch may be performed, resulting in the partially completed bipolar transistor device 200 illustrated in FIGS. 12A, 12B, 13A and 13B. As illustrated in FIGS. 12A, 12B and 13B, the wet oxide etch removes essentially all of the dielectric material 1110 from the trench 310 except for isolation spacers 1210. In one advantageous embodiment, the isolation spacers 1210 are located between a base contact region and an emitter. The unique shape of the trench 310, within which the dielectric material 1110 was deposited, plays an important role in the formation of such isolation spacers 1210. The corners where the base 1010 and the sidewall spacers 510 nearly come into contact, create an area where the wet oxide etch does not remove the dielectric material 1110. This area is affected by the wet etch in a similar fashion to a small trench filled with an oxide undergoing a traditional wet etch.

As a result of the unique shape of the trench 310, self aligned isolation spacers 1210 may be formed without the need of a mask. The cross-sectional view illustrated in FIG. 13B shows a cross-sectional view taken through the isolation spacers 1210.

Figure 14A:
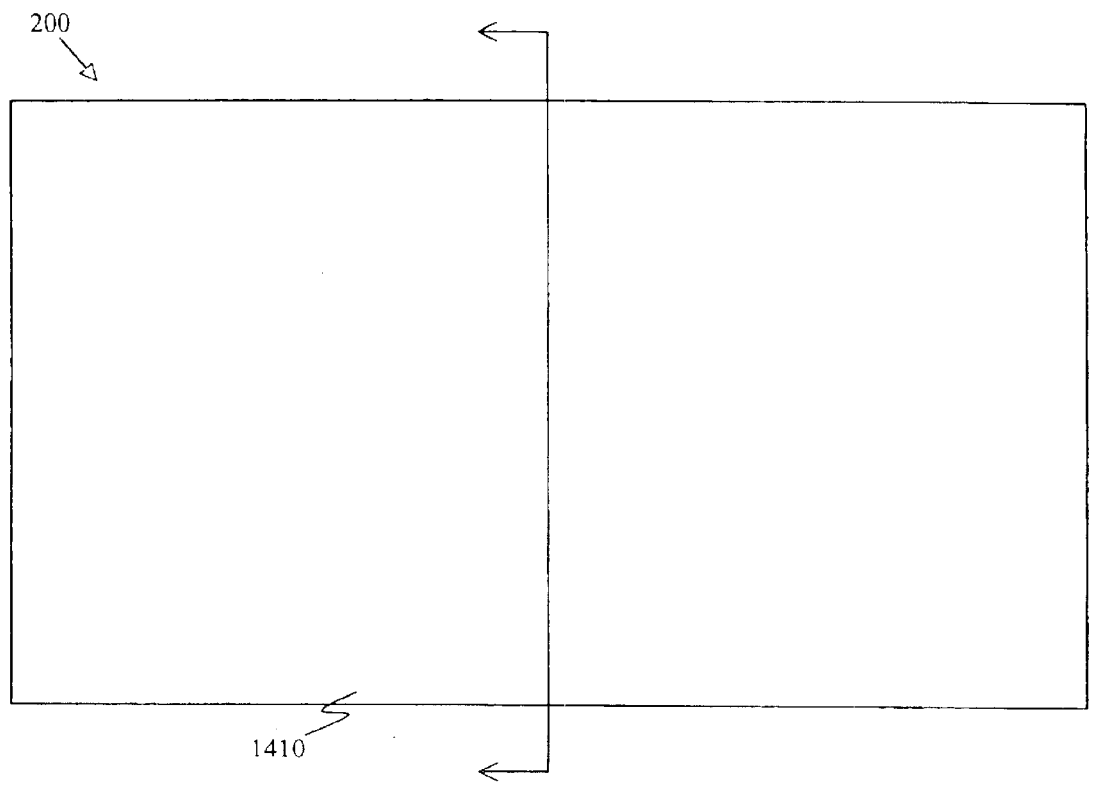
FIGS. 14A and 14B illustrate the partially completed bipolar transistor device illustrated in FIGS. 12A, 12B, 13A and 13B, after deposition of polysilicon over the surface of the device, and within the trench.
Figure 14B:
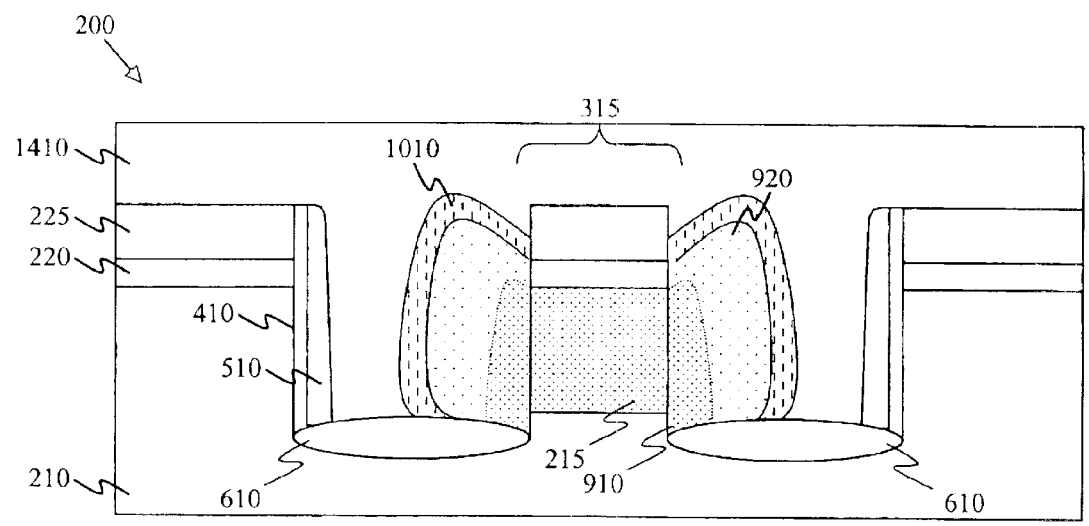
Figure 15A:
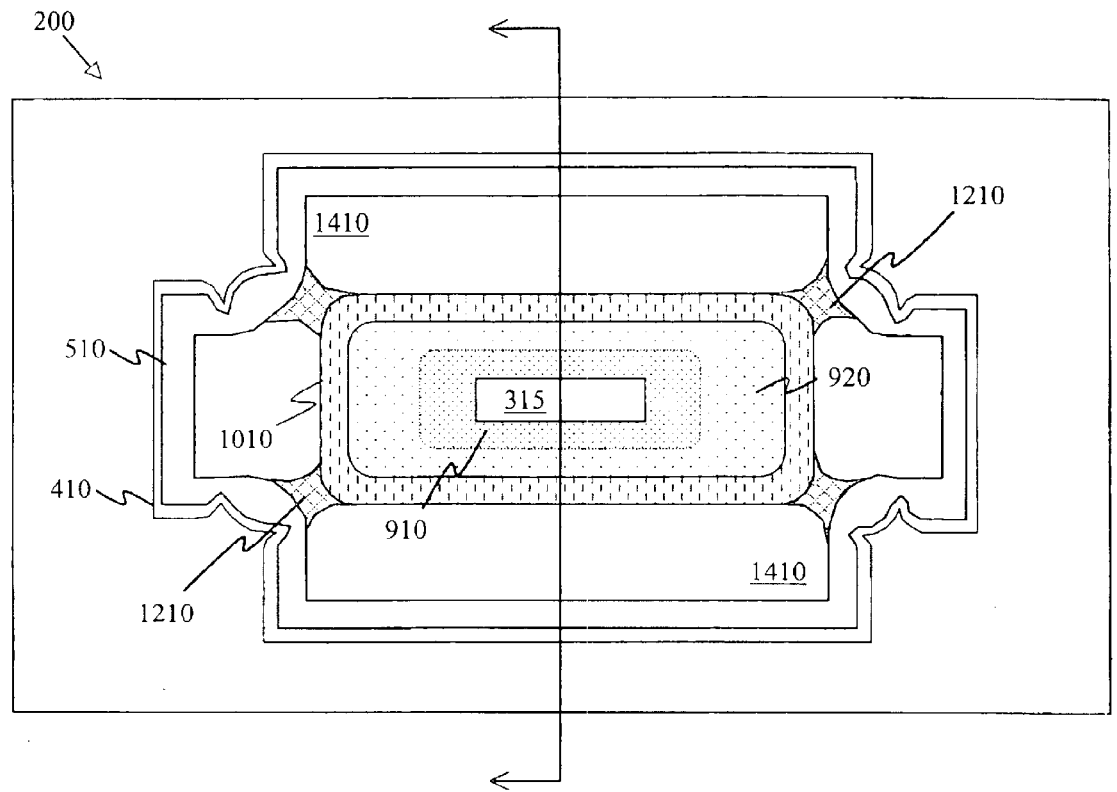
FIGS. 15A and 15B illustrate planarization of the device illustrated in FIGS. 14A and 14B.
Figure 15B:
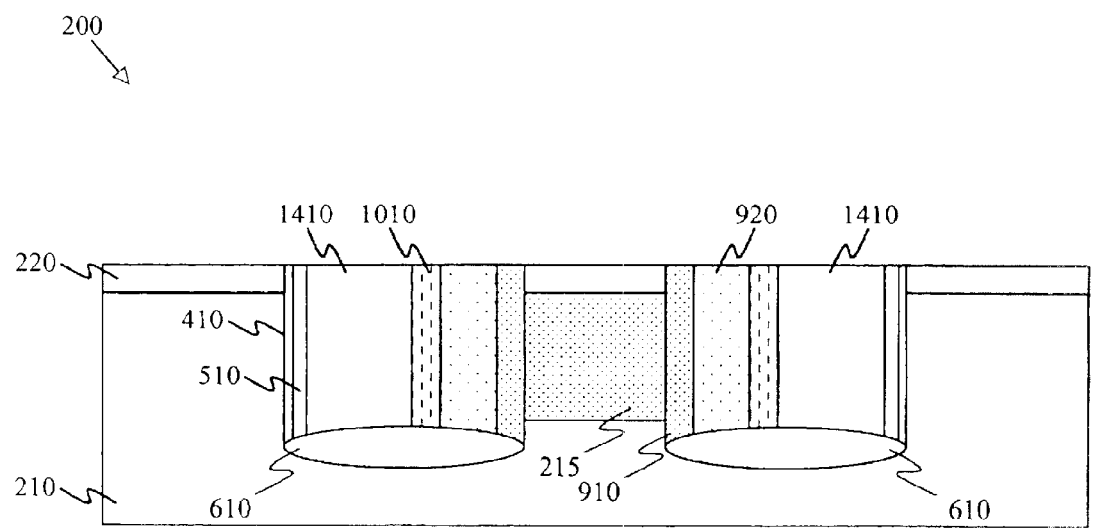

Turning to FIGS. 14A and 14B, illustrated is the partially completed bipolar transistor device 200 illustrated in FIGS. 12A, 12B, 13A and 13B, after deposition of another material 1410 over the surface of the device 200, and within the trench 310. In an exemplary embodiment the material 1410 is polysilicon. Polysilicon formed from a chemical vapor deposition (CVD) process is advantageous because it has excellent deposition properties and provides for rapid diffusion of dopants. Likewise, the material 1410 may be formed using many processes; however, in an exemplary embodiment the material 1410 is formed using a traditional CVD process. After the material 1410 is deposited, the partially completed bipolar transistor device 200 may be planarized, resulting in the device illustrated in FIGS. 15A and 15B. In the illustrative embodiment, the partially completed bipolar transistor device 200 is planarized to the etch stop layer 220, thus removing the sacrificial oxide layer 225 and planarizing the surface substantially flat. One having skill in the art knows how a basic surface is planarized, however, in one particularly advantageous embodiment, chemical mechanical planarization (CMP) is used to planarize the surface substantially flat.

Figure 16A:
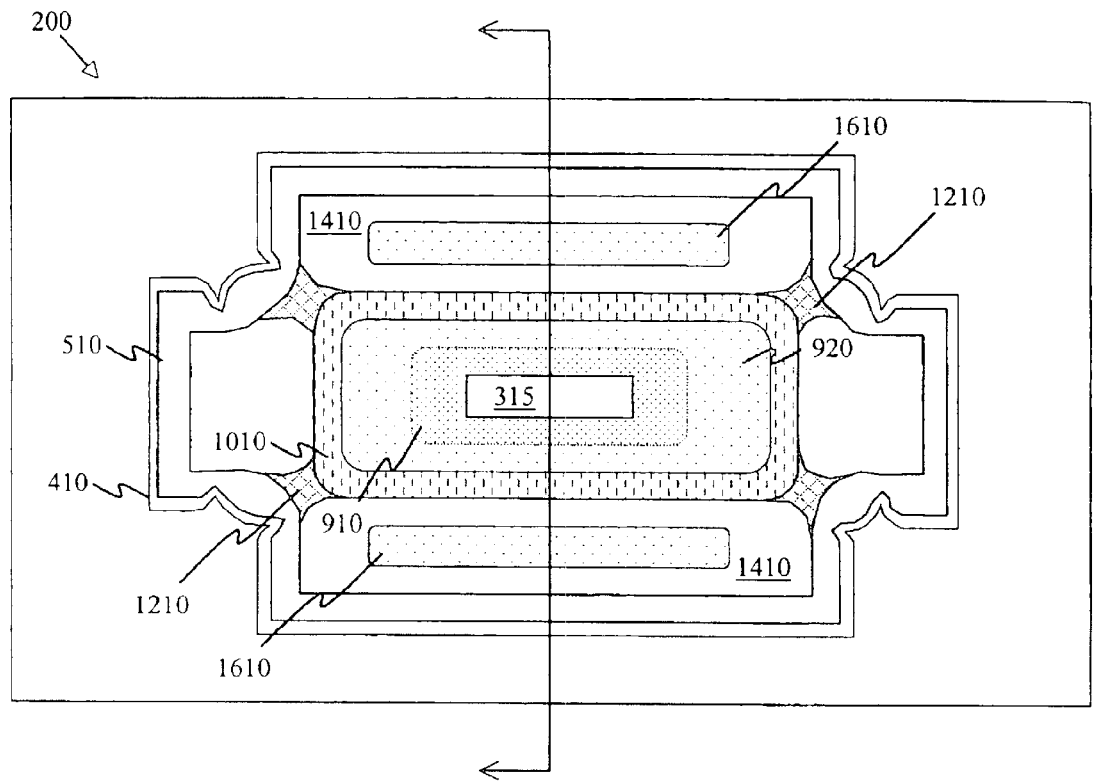
FIGS. 16A and 16B illustrate the formation of emitters within a portion of the polysilicon.
Figure 16B:
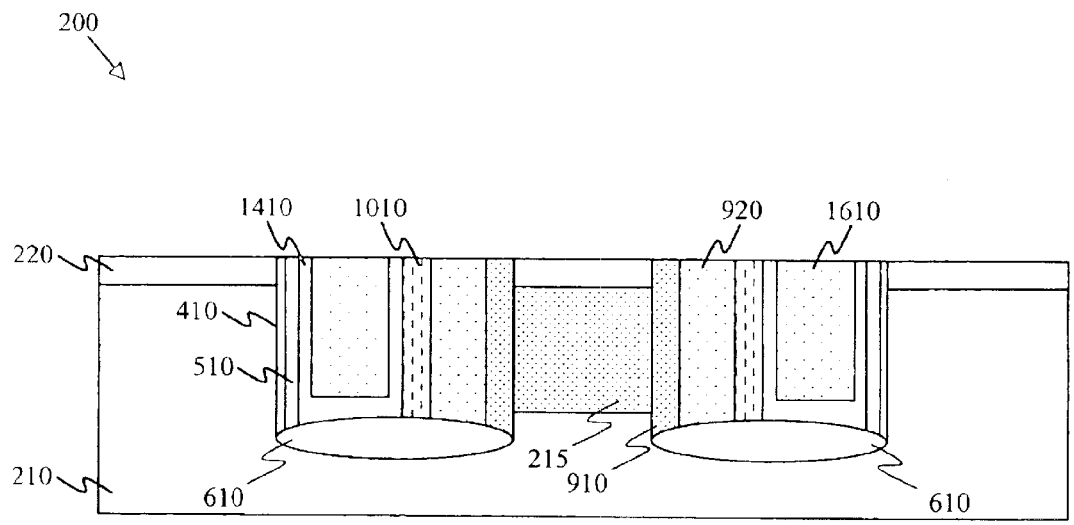

Turning to FIGS. 16A and 16B, illustrated is the formation of emitters 1610 within a portion of the material 1410. To form the emitters 1610, the area where the emitters 1610 are desired may be implanted with a dopant. In one particularly advantageous embodiment, the emitters 1610 are implanted with a heavy dose of arsenic, for example a dose of about $2E16/cm^3$. Typically, to isolate those regions where the dopant is desired from those regions where the dopant is not desired, photoresist is blanket deposited, patterned and developed, leaving the area where the dopant is desired unprotected by the photoresist. The doping process may then be conducted, forming emitters 1610 only where desired.

Figure 17A:
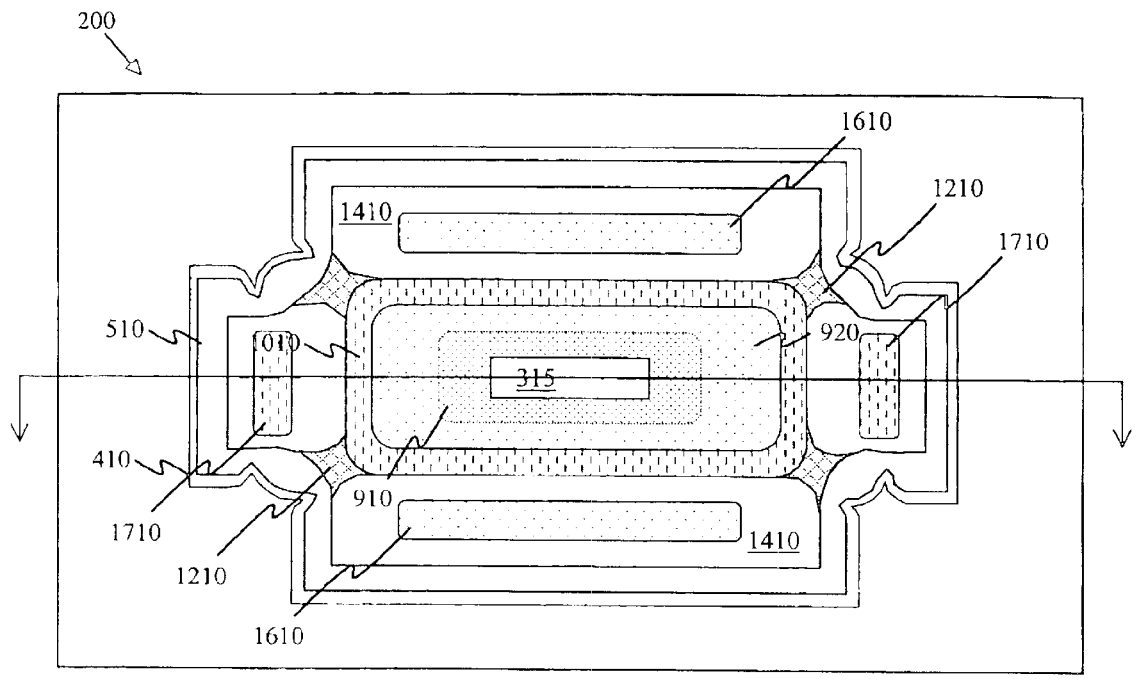
FIGS. 17A and 17B illustrate the formation of base contact regions within the remaining portions of the polysilicon.
Figure 17B:
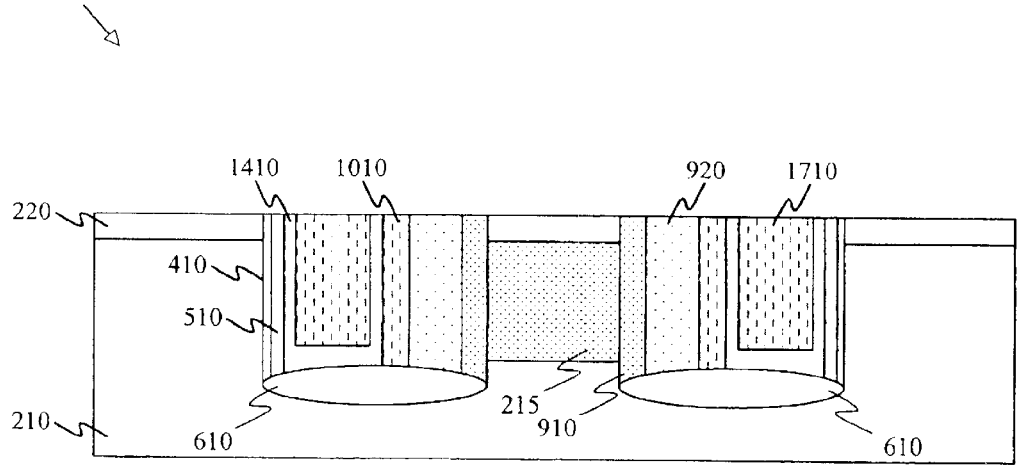

Turning to FIGS. 17A and 17B, illustrated is the formation of base contact regions 1710 within the remaining portions of the material 1410. The base contact regions 1710 are formed using a similar technique as the emitters 1610. However, where the emitters 1610 have arsenic or another n-type dopant located within, the base contact regions 1710 have a p-type dopant, such as boron, located within. The boron, in an exemplary embodiment, would be doped to a concentration of about $2E16/cm^3$. In an alternative embodiment, trenches could be formed in the desired polysilicon area 1410 and filled with n-type doped glass and planarized, leaving an alternative emitter. Following the deposition of the n-type doped glass and planarization, the same could be done with a p-type doped glass and planarization, resulting in an alternative base contact region.

Figure 18A:
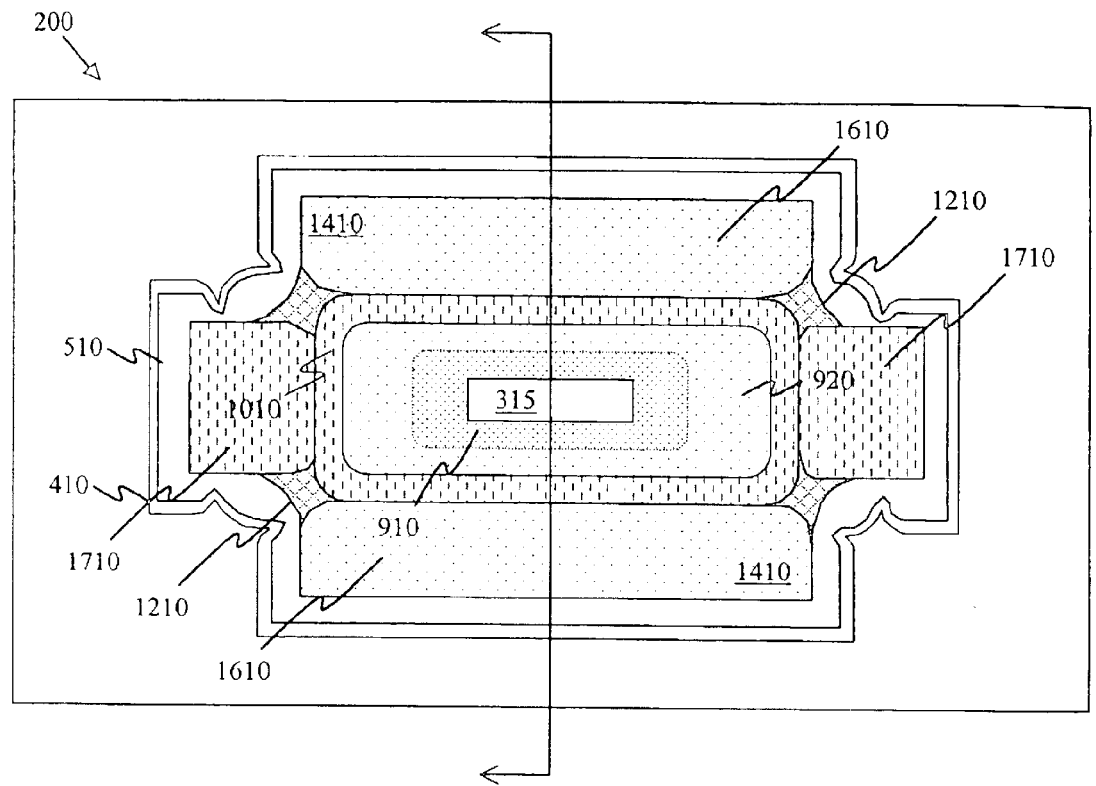
FIGS. 18A, 18B, 19A and 19B illustrate the partially completed bipolar transistor device illustrated in FIGS. 17A and 17B, after an annealing process.
Figure 18B:
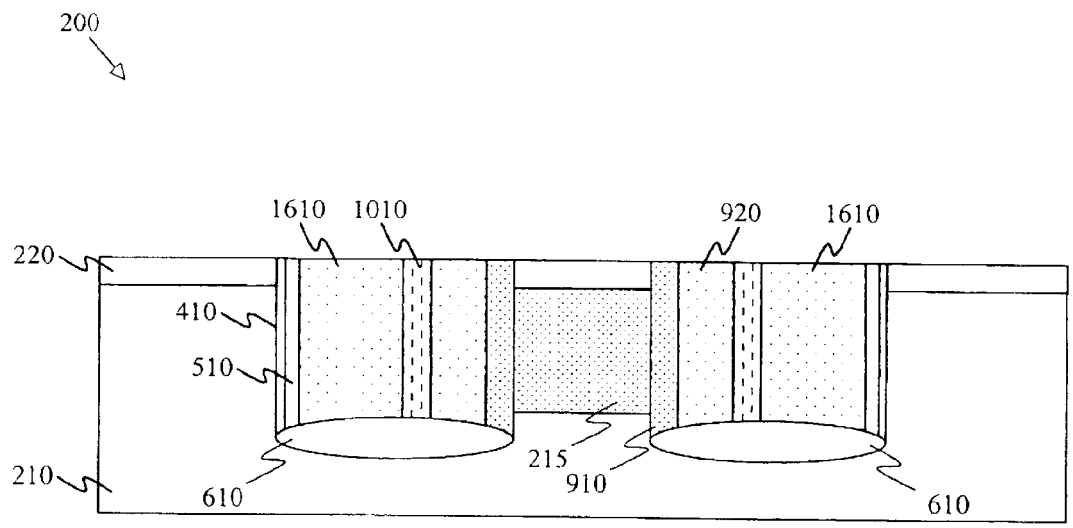
Figure 19A:
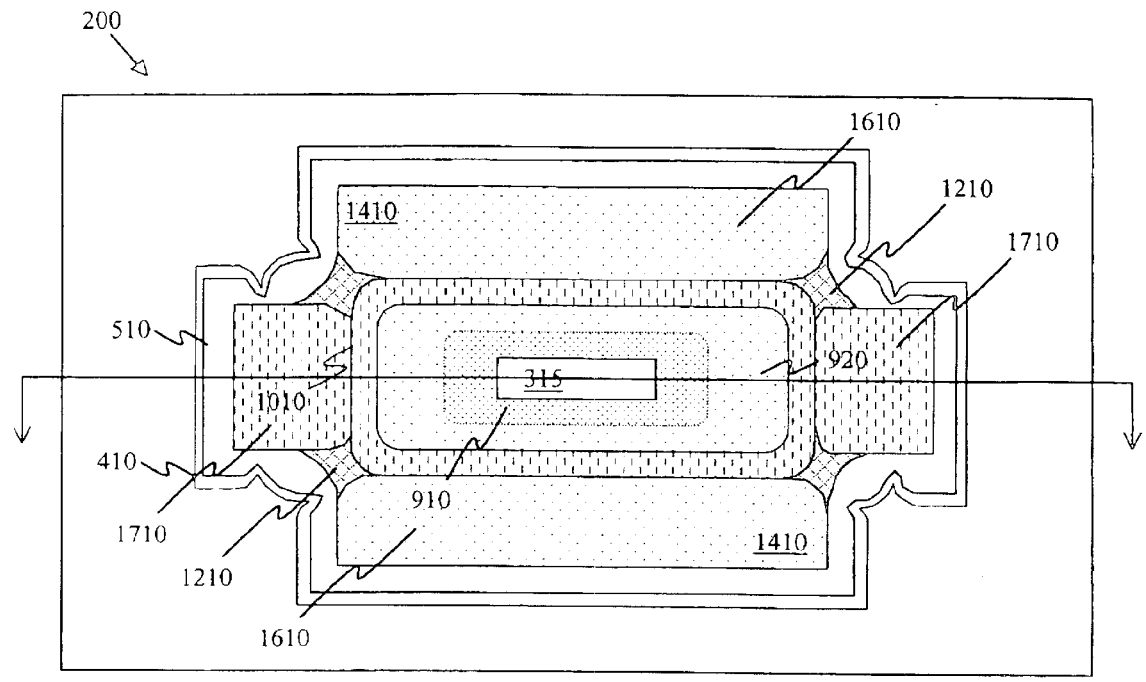
Figure 19B:
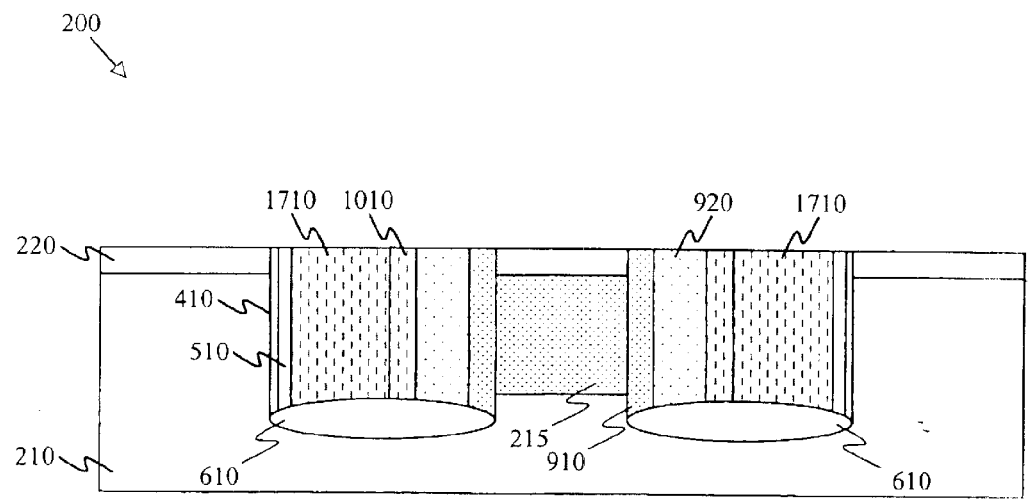

Illustrated in FIGS. 18A, 182, 19A and 19B is the partially completed bipolar transistor device 200 illustrated in FIGS. 17A and 17B, after an annealing process. As illustrated, FIG. 18B shows a cross-section taken through the emitters 1610 and FIG. 19B shows a cross-section taken through the base contact regions 1710. The anneal process is designed to activate the dopants and drive the dopant into, and throughout the polysilicon material 1410. In one advantageous embodiment the anneal is conducted at about 850° C. for about 10 minutes; however, the time and temperature of the anneal could vary as long as the dopants are diffused W throughout the polysilicon material and provide a high quality emitter base junction around the whole base that is exposed to the emitter contact region. Since the dopants are diffused throughout the polysilicon material, the base and emitter resistance may be decreased, which has a direct impact on the switching speed of the circuit. As illustrated, the anneal is conducted after formation of both the emitter 1610 and base contact region 1710; however, in an alternative embodiment two anneals could be conducted, one after the formation of the emitters 1610 and one after the formation of the base contact regions 1710. The emitters 1610 illustrated in FIGS. 18A and 18B may also be the emitters of the completed bipolar transistor device 100.

Figure 20A:
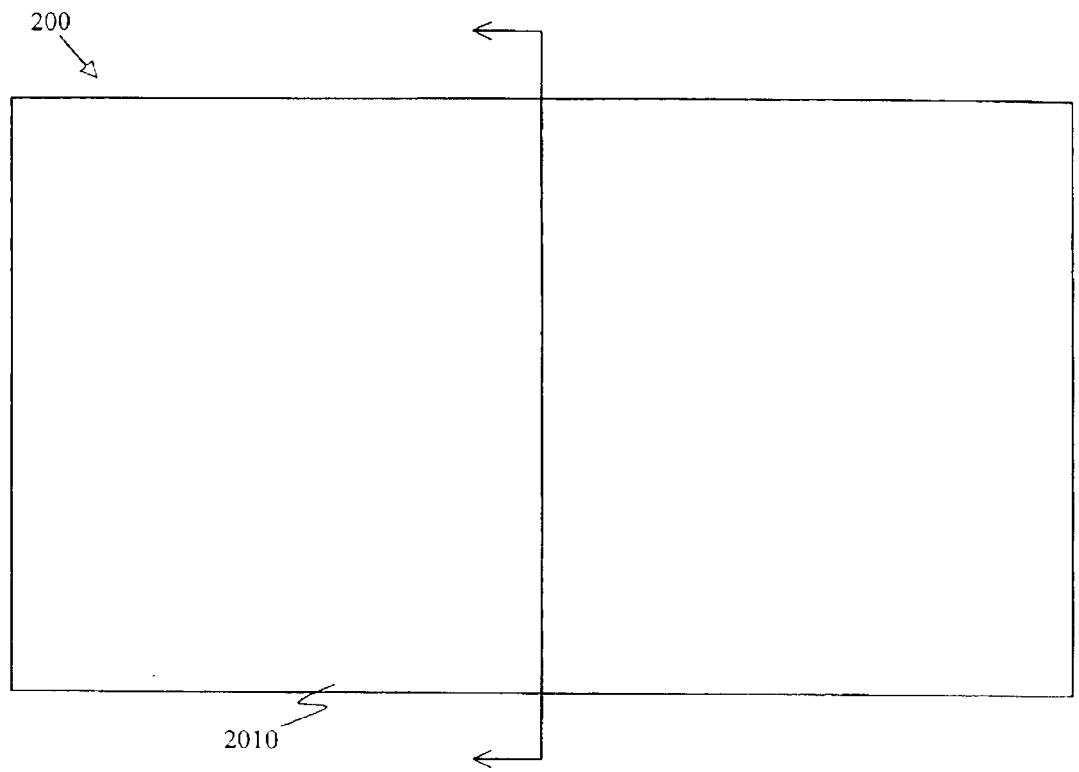
FIGS. 20A and 20B illustrate the partially completed bipolar transistor device illustrated in FIGS. 18A, 18B, 19A and 19B, after formation of an oxide layer.
Figure 20B:
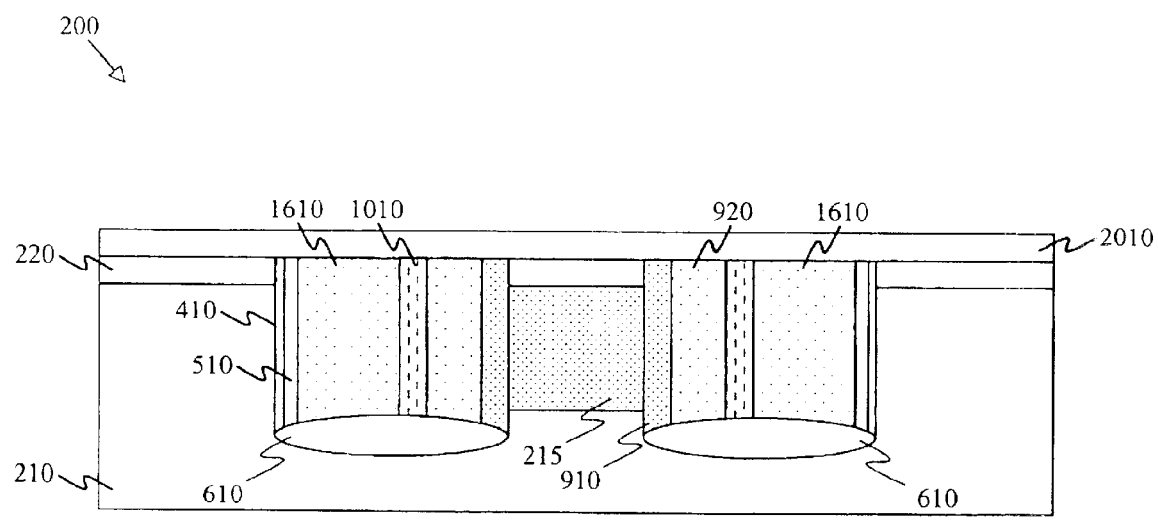

Turning to FIGS. 20A and 20B, illustrated is the partially completed bipolar transistor device 200 illustrated in FIGS. 18A, 18B, 19A and 19B, after formation of an oxide layer 2010. The deposition of the oxide layer 2010 is an optional step; however, it is desirable, since it helps with overlap in the plugs, which are formed in FIGS. 23A, 23B, 24A and 24B, and helps reduce capacitance in the completed device 100. The oxide layer 2010 can be formed using conventional processes.

Figure 21A:
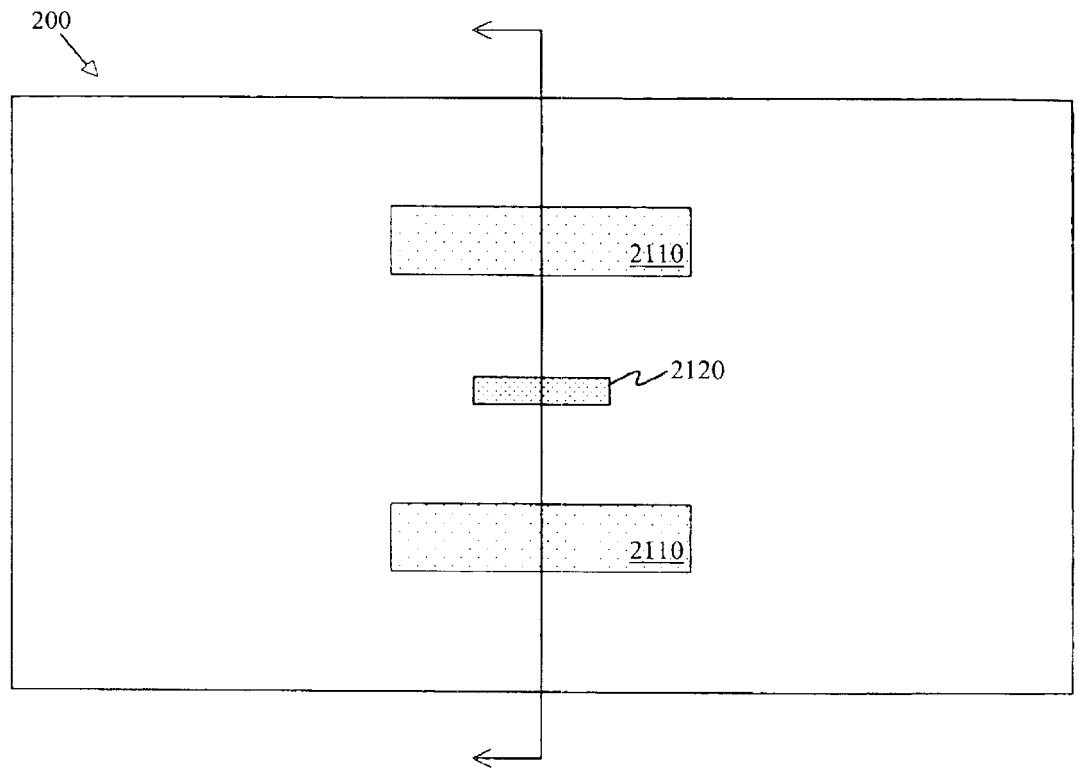
FIGS. 21A and 21B illustrate the partially completed bipolar transistor device illustrated in FIGS. 20A and 20B after formation of contact trenches within the emitters and the collector contact region, respectively.
Figure 21B:
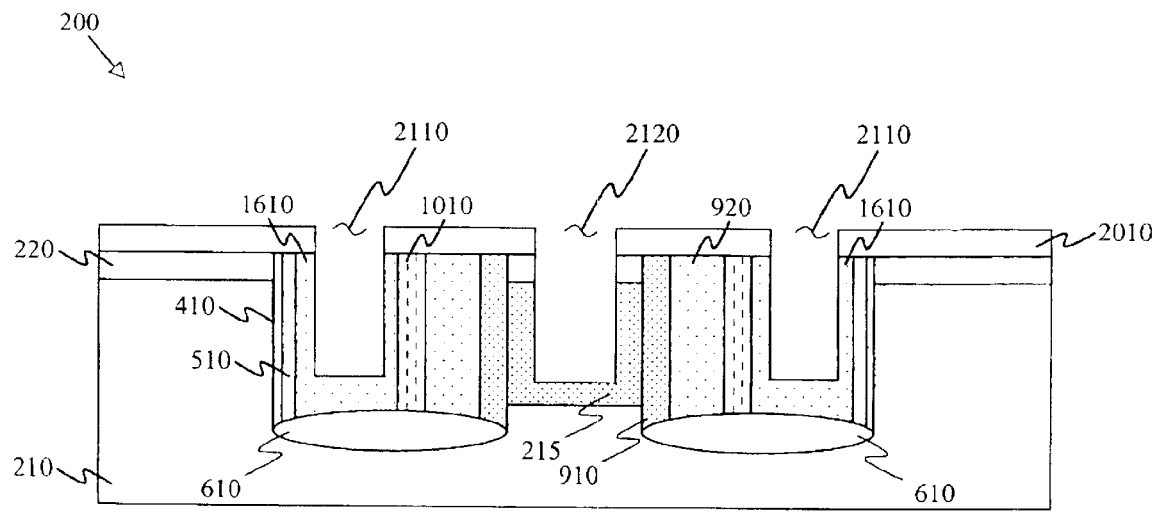

Turning to FIGS. 21A and 21B, illustrated is the partially completed bipolar transistor device 200 illustrated in FIGS. 20A and 20B after formation of contact trenches 2110 and 2120 within the emitters 1610 and the collector contact region 215, respectively. The trenches 2110, 2120 are typically formed by depositing and patterning a layer of photoresist, such that the photoresist remains over portions of the partially completed bipolar transistor device 200 where no trench is desired, and etching the unprotected areas. In one particularly advantageous embodiment of the present invention, the trenches 2110, 2120 are formed having a depth of about 300 nm.

Figure 22A:
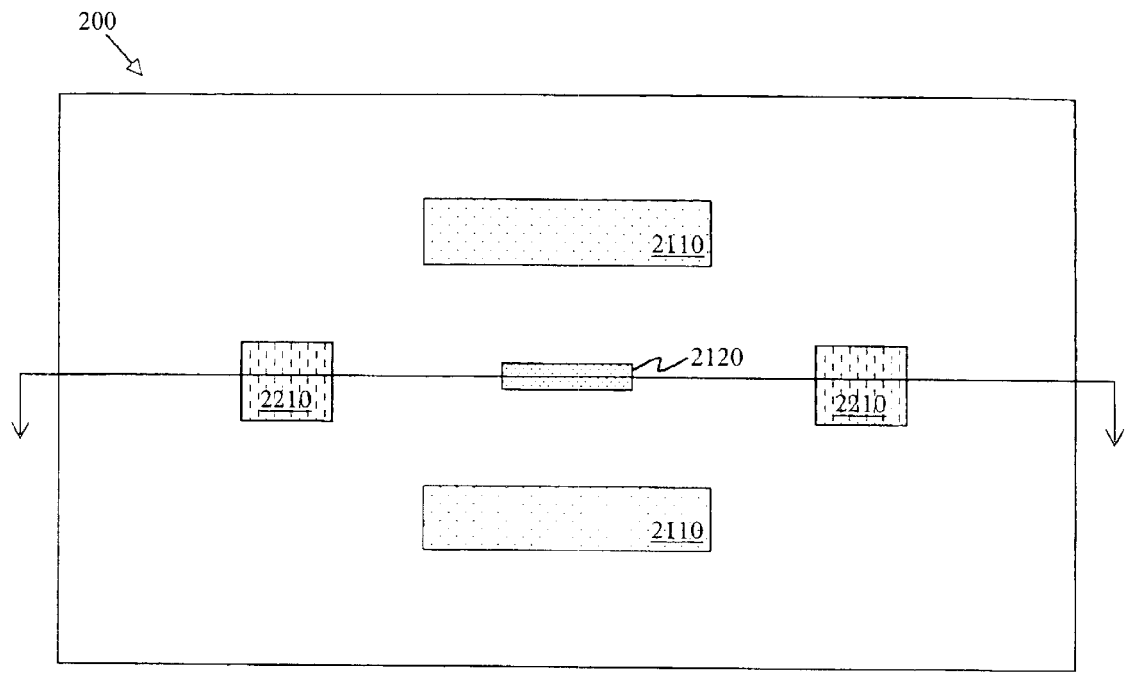
FIGS. 22A and 22B illustrate the formation of trenches within the base contact regions.
Figure 22B:
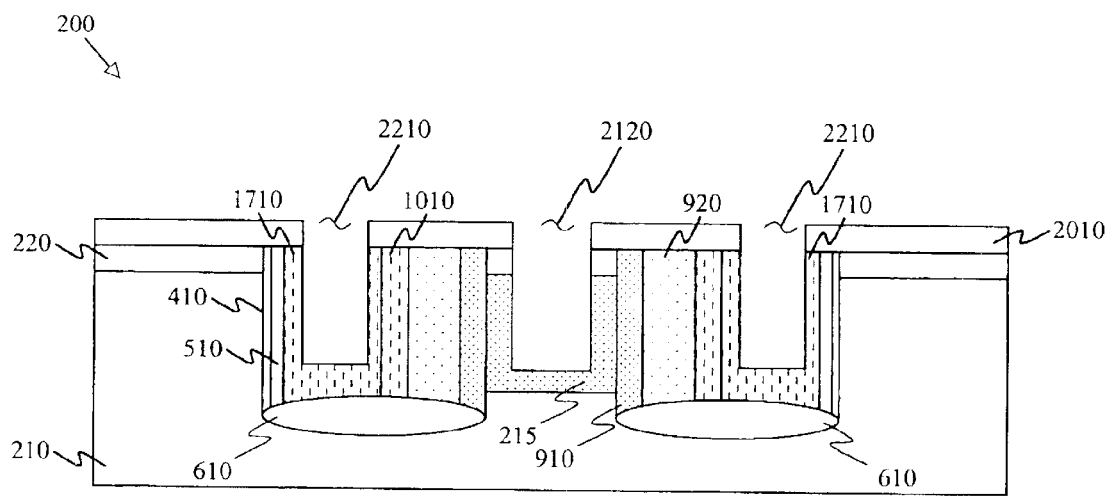

Turning to FIGS. 22A and 22B, illustrated is the formation of a trench 2210 within the base contact regions 1710. The trench is formed in a similar way as the other trenches 2110, 2120. In an exemplary embodiment, all the trenches 2110, 2120, 2210 are formed in a single step, saving both time and money.

Figure 23A:
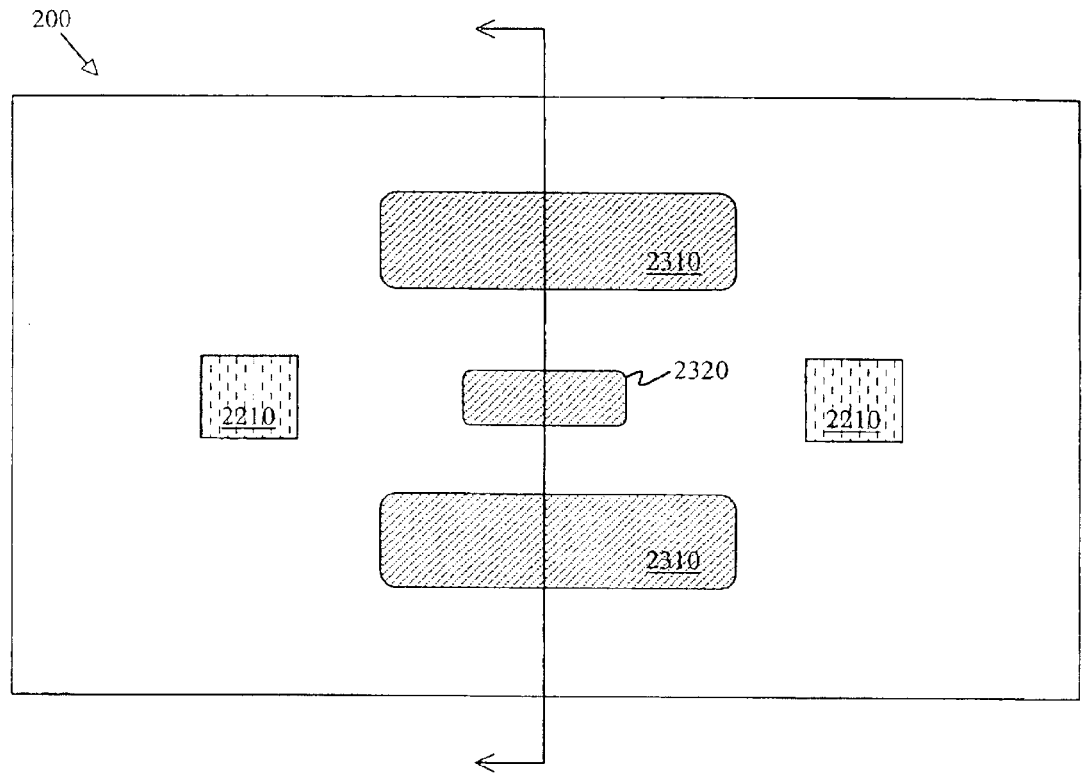
FIGS. 23A and 23B illustrate the formation of emitter plugs and a collector plug.
Figure 23B:
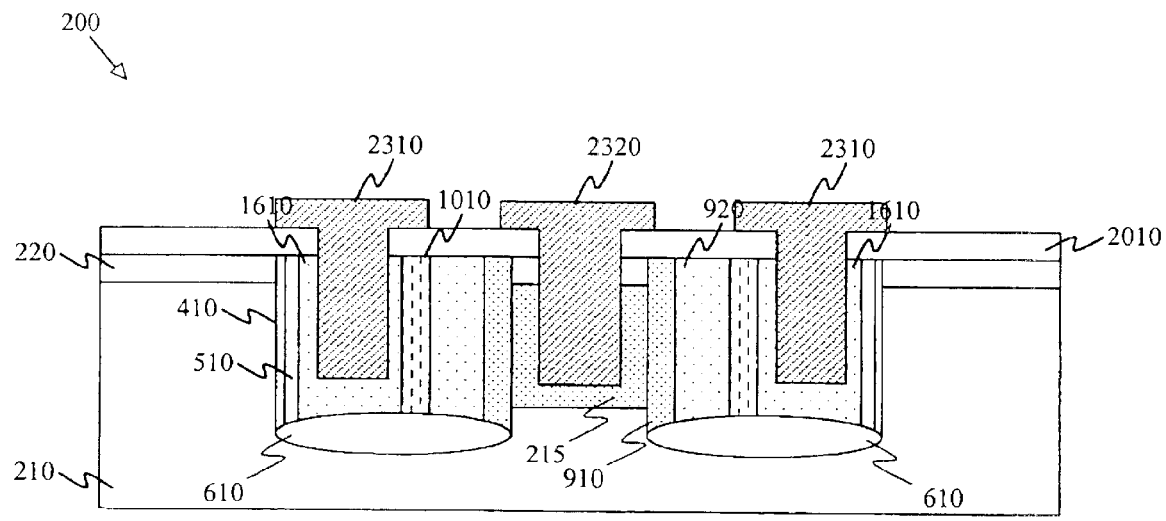

Illustrated in FIGS. 23A and 23B, is the formation of an emitter plug 2310 and a collector plug 2320. The emitter plug 2310 and collector plug 2320 are typically formed using conventional contact metallization processes. Moreover, the emitter plug 2310 and collector plug 2320, in an exemplary embodiment, could each include a titanium/titanium silicide contact layer, a titanium nitride barrier layer and a tungsten plug. Tungsten is an exemplary embodiment for the plugs 2310, 2320, because the electrical resistance of tungsten is much lower than that of silicon. However, one having skill in the art knows that other materials could be used, and that the inclusion of the =titanium/titanium silicide contact layer and titanium nitride barrier layer depends upon the design of the device. As illustrated, the emitter plug 2310 directly contacts the emitter 1610; however, one having skill in the art knows that the emitter plug 2310 could contact an emitter contact region, wherein the emitter contact region is located proximate the bipolar transistor device and electrically connected to the emitter 1610.

Figure 24A:
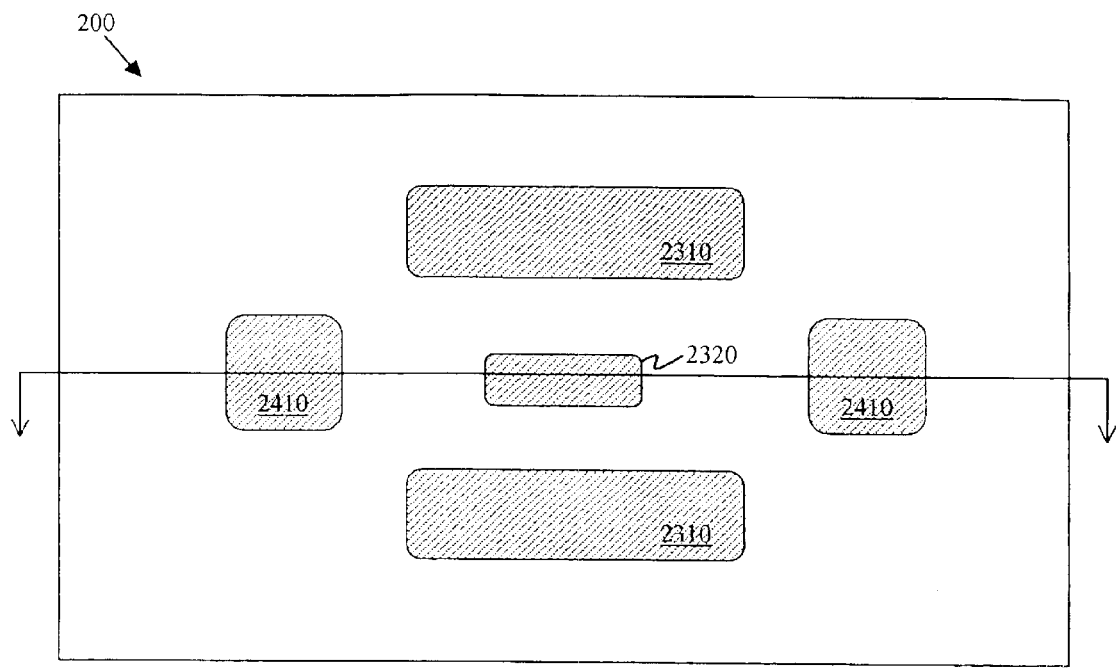
FIGS. 24A and 24B illustrate the formation of base plugs.
Figure 24B:
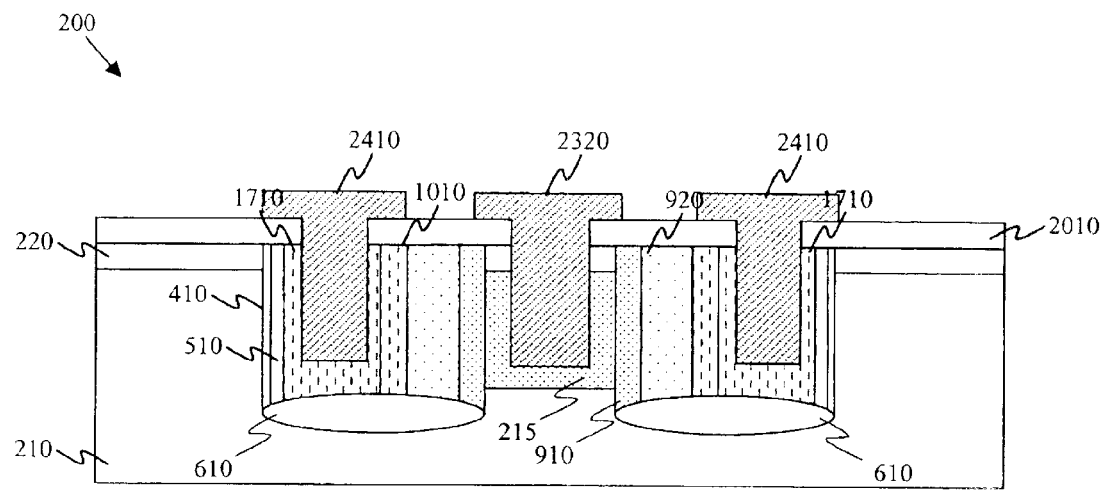

Turning to FIGS. 24A and 24B, illustrated is the formation of a base plug 2410. The base plug 2410 is formed using a similar process to that used to form the emitter plug 2310 and collector plug 2320. In an exemplary embodiment, the emitter plug 2310, collector plug 2320 and base plug 2410 are formed in the same processing step. One exemplary function of the emitter plug 2310, collector plug 2320 and base plug 2410 is to open up vertical contacts to the emitter, collector and base, respectively, and provide lateral current flow among the three without a need for the current to go around corners in the metal or silicon diffusions, like in prior art bipolar transistors. Another exemplary function of the emitter plug 2310, collector plug 2320 and base plug 2410 is that they provide a very short distance for current to travel from the base 1710 and emitter 1610, to the collector contact region 215, thereby reducing transit time and parasitic capacitance. It should be noted that the plugs 2310, 2320, 2410 could be formed touching the emitter 1610, collector contact region 215 and base contact region 1710, respectively, rather than being formed within each. The completed bipolar transistor device 100 illustrated in FIGS. 1A, 1B, 1C, and 1D results after formation of the emitter plug 2310, collector plug 2320 and base plug 2410. Subsequent metallization and intermetal deposition could then proceed according to standard integrated circuit (IC) manufacturing processes.

Figure 25:
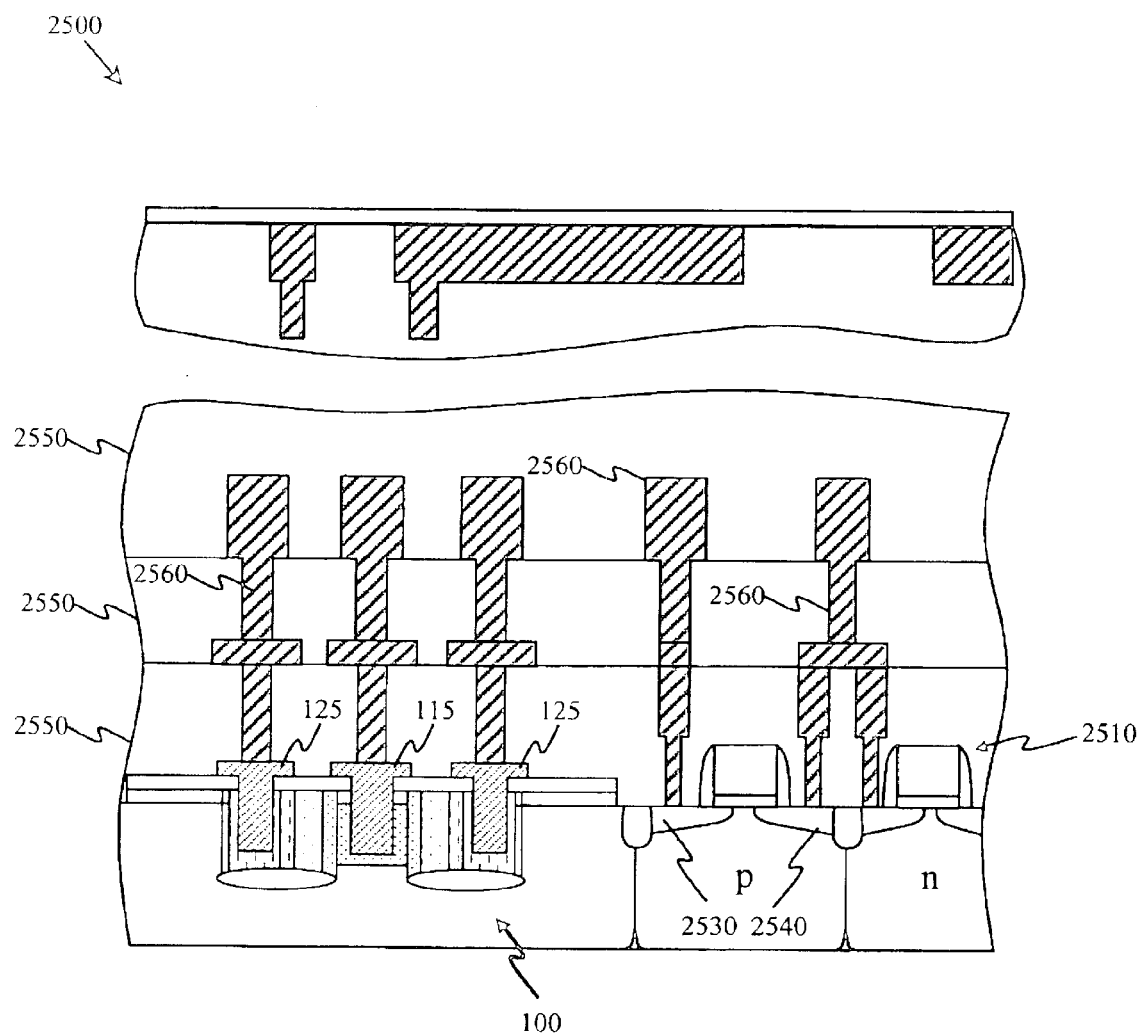
FIG. 25 illustrates a completed integrated circuit, which is one embodiment in which the present invention may be used.

Turning to FIG. 25, illustrated is a completed integrated circuit 2500, which represents one environment in which the completed bipolar transistor 100 could be used. The integrated circuit 2500 may include the completed bipolar transistor device 100, illustrated in FIGS. 1A, 1B, 1C and 1D, complementary metal oxide semiconductor (CMOS) devices, bipolar CMOS (BiCMOS) devices, dynamic random access memory (DRAM) devices, electrically erasable programmable read-only memory (EEPROM) devices, including Flash EPROMS, or any other type of similar device. Also shown in one advantageous embodiment of the integrated circuit 2500, are components of the conventional integrated circuit 2500, including: a transistor 2510, a source region 2530, a drain region 2540, and dielectric layers 2550. Interconnect structures 2560, are located within the dielectric layer 2550, to contact the emitter plug, collector plug 115, base plug 125 and transistors 2510, to form the operational integrated circuit 2500.

Although the present invention has been described in detail, those skilled in the art should understand that they can make various changes, substitutions and alterations herein without departing from the spirit and scope of the invention in its broadest form.

What is claimed is:

1. A bipolar transistor, comprising:
   a semiconductor substrate having a trench located therein, wherein the trench does not extend all the way through the semiconductor substrate thereby causing a lower surface of the trench to be located within the semiconductor substrate;
   a dielectric region located on the entire lower surface of the trench;
   a collector located in the semiconductor substrate and at least partially over the dielectric region;
   a base located over and in contact with the dielectric region and at least partially about the collector; and
   an emitter located over and in contact with the dielectric region and adjacent the base.

2. The bipolar transistor as recited in claim 1 wherein the collector has a collector contact plug located therein.

3. The bipolar transistor as recited in claim 2 wherein the collector contact plug is a metal collector contact plug.

4. The bipolar transistor as recited in claim 3 wherein the metal collector contact plug is a tungsten collector contact plug.

5. The bipolar transistor as recited in claim 2 wherein the collector includes a collector contact region and the collector contact plug is located in the collector contact region.

6. The bipolar transistor as recited in claim 1 wherein the base has abase contact plug located therein.

7. The bipolar transistor as recited in claim 6 wherein the base contact plug is a metal base contact plug.

8. The bipolar transistor as recited in claim 7 wherein the metal base contact plug is a tungsten base contact plug.

9. The bipolar transistor as recited in claim 6 wherein the base includes a base contact region and the base contact plug is located in the base contact region.

10. The bipolar transistor as recited in claim 9 wherein the base contact region comprises polysilicon.

11. The bipolar transistor as recited in claim 1 wherein the emitter has an emitter contact plug located therein.

12. The bipolar transistor as recited in claim 11 wherein the emitter contact plug is a metal emitter contact plug.

13. The bipolar transistor as recited in claim 12 wherein the metal emitter contact plug is a tungsten emitter contact plug.

14. The bipolar transistor as recited in claim 1 wherein the dielectric region is a field oxide region.

15. The bipolar transistor as recited in claim 1 wherein the collector includes a high dose region and a low dose region.

16. The bipolar transistor as recited in claim 9 further including an isolation strut located between the base contact region and the emitter.

17. A bipolar transistor, comprising:
    a semiconductor substrate having a trench located therein, wherein the trench does not extend all the way through the semiconductor substrate thereby causing a lower surface of the trench to be located within the semiconductor substrate
    a collector located in the semiconductor substrate;
    a base located in the trench adjacent the collector;
    an emitter located completely in the trench adjacent the base; and
    a dielectric region located in on the entire lower surface of the trench beneath the base and the emitter, isolating them from the semiconductor substrate.

18. The bipolar transistor recited in claim 17 wherein the base is located at least partially about the collector.

19. The bipolar transistor recited in claim 17 wherein the collector is a post located in a trench formed in the semiconductor substrate.

20. The bipolar transistor as recited in claim 17 wherein the base contacts a base contact region located in the trench.

21. The bipolar transistor as recited in claim 20 wherein the base contact region comprises polysilicon.

22. The bipolar transistor as recited in claim 17 wherein the emitter is located in an emitter contact region located in the trench.

23. The bipolar transistor as recited in claim 22 wherein the emitter comprises polysilicon.

24. The bipolar transistor as recited in claim 23 wherein an outer sidewall of the trench includes an oxide layer.

25. The bipolar transistor as recited in claim 24 further including a nitrided layer located on the oxide layers.

26. The bipolar transistor as recited in claim 17 wherein the base includes a base contact plug located therein.

27. The bipolar transistor as recited in claim 26 wherein the base contact plug is a metal base contact plug.

28. The bipolar transistor as recited in claim 27 wherein the metal base contact plug is a tungsten base contact plug.

29. The bipolar transistor as recited in claim 17 wherein the emitter includes an emitter contact plug located therein.

30. The bipolar transistor as recited in claim 29 wherein the emitter contact plug is a metal emitter contact plug.

31. The bipolar transistor as recited in claim 30 wherein the metal emitter contact plug is a tungsten emitter contact plug.

32. The bipolar transistor as recited in claim 17 wherein the collector includes a collector contact plug located therein.

33. The bipolar transistor as recited in claim 32 wherein the collector contact plug is a metal collector contact plug.

34. The bipolar transistor as recited in claim 33 wherein the metal collector contact plug is a tungsten collector contact plug.

* * * * *